US007975207B2

(12) United States Patent  
Hwang et al.

(10) Patent No.: US 7,975,207 B2  
(45) Date of Patent: Jul. 5, 2011

(54) APPARATUS AND METHOD FOR RECORDING DATA IN INFORMATION RECORDING MEDIUM TO WHICH EXTRA ECC IS APPLIED OR REPRODUCING DATA FROM THE MEDIUM

(75) Inventors: Sung-hee Hwang, Suwon-si (KR); Hyun-kwon Chung, Seoul (KR); Joon-hwan Kwon, Suwon-si (KR); Hyun-jeong Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1174 days.

(21) Appl. No.: 11/623,813

(22) Filed: Jan. 17, 2007

(65) Prior Publication Data

US 2008/0034269 A1 Feb. 7, 2008

(30) Foreign Application Priority Data

Aug. 3, 2006 (KR) .................. 10-2006-0073257

(51) Int. Cl.  
*G11C 29/00* (2006.01)
(52) U.S. Cl. ......... 714/769; 714/755; 714/758; 714/781
(58) Field of Classification Search .................. 714/758, 714/769

See application file for complete search history.

(56) References Cited

U.S. PATENT DOCUMENTS

| 5,224,106 | A  | * | 6/1993 | Weng ........................... 714/755 |
| 7,047,476 | B2 |   | 5/2006 | Nagai et al. |
| 2004/0114484 | A1 |   | 6/2004 | Sako et al. |
| 2005/0028067 | A1 | * | 2/2005 | Weirauch ...................... 714/758 |
| 2007/0198893 | A1 |   | 8/2007 | Hwang et al. |
| 2007/0245215 | A1 |   | 10/2007 | Hwang et al. |

FOREIGN PATENT DOCUMENTS

| KR | 2007-80692 | 8/2007 |
| KR | 2007-99387 | 10/2007 |
| WO | WO 2006/009290 | 1/2006 |

OTHER PUBLICATIONS

PCT International Search Report and Written Opinion issues in corresponding PCT International Application No. PCT/KR2007/003437 dated Oct. 18, 2007.

* cited by examiner

*Primary Examiner* — Sam Rizk  
(74) *Attorney, Agent, or Firm* — NSIP Law

(57) ABSTRACT

A data recording and/or reproducing apparatus and method for an information recording medium includes: an extra ECC encoder; and an extra ECC controller determining whether extra ECC is applied to the information recording medium, and controlling the extra ECC encoder to generate an extra parity data block corresponding to data that is to be recorded on the information storage medium. The extra ECC encoder includes: an extra parity generator generating an extra ECC data block based on data that is to be recorded on the information recording medium, performing ECC on the extra ECC data block, and generating at least one extra parity. An extra parity interleaver interleaves the at least one extra parity and generating the extra parity data block.

57 Claims, 19 Drawing Sheets

APPARATUS AND METHOD FOR RECORDING DATA IN INFORMATION RECORDING MEDIUM TO WHICH EXTRA ECC IS APPLIED OR REPRODUCING DATA FROM THE MEDIUM

CROSS-REFERENCE TO RELATED APPLICATION

This application claims the benefit of Korean Application No. 2006-73257, filed Aug. 3, 2006 in the Korean Intellectual Property Office, the disclosure of which is incorporated herein by reference.

BACKGROUND OF THE INVENTION

1. Field of the Invention

Aspects of the present invention relate to an apparatus and method for recording data in an information recording medium in which data is subjected to error correction coding (ECC) and stored, and/or for reproducing data from the information recording medium.

2. Description of the Related Art

An error correction coding (ECC) format standardized for an existing optical disc system (such as DVDs, HD DVDs, Blu-ray discs, etc.) defines ECC performance for burst errors, such as scratches or fingerprints and for random errors such as dust. When discs are frequently used, the reliability of data recorded on the disc gradually deteriorates, due to dust, scratches, fingerprints, the influence of a recording power or a reproduction power and according to a user's disc management state. Particularly, when burst errors generated by physical scratches on the surface of the disc seriously damage data, it is difficult to restore the data.

Recently, DVDs have been developed that can correct successive errors with a length corresponding to 16 rows (16× 183+10 bytes) of the ECC format. A length which can be corrected at once depends on a recording density. In the case of general DVDs, successive errors corresponding to a physical length of about 6 mm can be corrected. In the case of HD DVDs, successive errors corresponding to a physical length of about 6.4 mm can be corrected. In the case of Blu-ray discs, successive errors corresponding to a physical length of about 9 mm can be corrected.

Disc deterioration due to frequent use gradually makes the state of the disc worse. Data reliability is lowered due to successive errors (such as scratches or fingerprints), which reduce the lifespan of the disc. Also, physical scratches on the disc surface significantly increase the probability of the failure of error correction when data is reproduced. The physical scratches on the disc surface can be created when an objective lens of a pick-up for recording and reproducing collides with the disc surface or due to a user's management carelessness. Due to such data reliability deterioration, if error correction of data is impossible when the data is reproduced, data information recorded by a user will be lost. Also, in order to compensate for such data reliability deterioration, if data is recorded in a new ECC format not considering compatibility with an existing ECC format, reproduction compatibility with existing products is not ensured and thus many limitations in the use of discs will be passed on to the users.

SUMMARY OF THE INVENTION

Aspects of the present invention provide a recording/reproducing apparatus and method, which are capable of enhancing the reliability of data recording/reproducing, while maintaining compatibility with an existing error correction coding (ECC) format.

Additional aspects and/or advantages of the invention will be set forth in part in the description which follows and, in part, will be obvious from the description, or may be learned by practice of the invention.

According to an aspect of the present invention, a recording apparatus for an information recording medium in which data is subjected to error correction coding (ECC) and stored includes: an extra ECC encoder; and an extra ECC controller determining whether an extra ECC is applied to the information recording medium, and controlling the extra ECC encoder to generate an extra parity data block corresponding to data that is to be recorded on the information storage medium, wherein the extra ECC encoder includes: an extra parity generator generating an extra ECC data block based on data that is to be recorded on the information recording medium, performing ECC on the extra ECC data block, and generating at least one extra parity; and an extra parity interleaver interleaving the at least one extra parity and generating the extra parity data block.

According to another aspect of the present invention, a reproducing apparatus for an information recording medium in which data and an extra parity data block are subjected to error correction coding (ECC) and stored includes: an extra ECC controller determining whether the data is reproduced from the information recording medium using an extra ECC, and obtaining an extra parity data block corresponding to data that is to be reproduced, from the information recording medium; an extra parity deinterleaver deinterleaving the extra parity data block and obtaining at least one extra parity; an extra ECC block decoder generating an extra ECC block by combining the extra ECC data block generated from an ECC block for the data that is to be reproduced, with the at least one extra parity, and performing error correction on the extra ECC block; an extra ECC block updater updating an extra ECC data block obtained from the error-corrected extra ECC block to a corresponding ECC block; and an ECC decoder performing error correction on the updated ECC block.

According to another aspect of the present invention, a recording apparatus for an information recording medium in which data is subjected to error correction coding (ECC) and stored includes: a file system drive outputting a data writing command; and a physical drive receiving the data writing command from the file system drive, generating an extra parity data block corresponding to the data, recording the extra parity data block in the information recording medium, and managing and performing the extra ECC.

According to another aspect of the present invention a reproducing apparatus for an information recording medium in which data is subjected to error correction coding (ECC) and stored includes: a file system drive outputting a data read command; and a physical drive receiving the data read command from the file system drive, reading an extra parity data block corresponding to the data from the information recording medium, performing error correction on the extra parity data block, and transferring the error-corrected result to the file system drive.

According to another aspect of the present invention, a recording apparatus for an information recording medium in which data is subjected to error correction coding (ECC) and stored includes: a physical drive transferring/receiving at least one part of an ECC block of user data; and a file system drive receiving the at least one block of the ECC block from the physical drive, generating an extra parity data block using the at least one block of the ECC block, and managing extra ECC recording.

According to another aspect of the present invention, a reproducing apparatus for an information recording medium in which data is subjected to error correction coding (ECC) and stored includes: a physical drive reading an extra parity data block corresponding to user data, from the information recording medium, and transferring the extra parity data block, in response to a data read command from a file system drive; and the file system drive performing error correction on the extra parity data block received from the physical drive, and managing and performing extra ECC.

According to another aspect of the present invention, a recording apparatus for an information recording medium in which data is subjected to error correction coding (ECC) and stored includes: a file system drive transmitting to a physical drive a command to generate an extra parity data block from user data; and the physical drive generating the extra parity data block from user data and recording the extra parity data block in the information recording medium, under the control of the file system drive, wherein the file system drive performs extra ECC together with the physical drive.

According to another aspect of the present invention, a reproducing apparatus for an information recording medium in which data is subjected to error correction coding (ECC) and stored includes: a file system drive transmitting to a physical drive a command to read user data from the information recording medium; a physical drive reading an extra parity data block corresponding to user data from the information recording medium, performing error correction on the extra parity data block, and transferring the error-corrected result to the file system drive, under the control of the file system drive, wherein the file system drive performs extra ECC together with the physical drive.

According to another aspect of the present invention, a method of recording data in an information recording medium in which data is subjected to error correction coding (ECC) and stored includes: determining whether an extra ECC is applied to the information recording medium; if the extra ECC is applied to the information recording medium, generating an extra ECC data block based on data that is to be recorded on the information recording medium, performing error correcting coding (ECC) on the extra ECC data block, and generating at least one extra parity; and generating the extra parity data block by interleaving the at least one extra parity and recording the extra parity data block in the information recording medium.

According to another aspect of the present invention, a method of reproducing data from an information recording medium in which data and an extra parity data block are subjected to error correction coding (ECC) and stored includes: determining whether data is reproduced from the information recording medium using an extra ECC; reading an extra parity data block corresponding to data that is to be reproduced from the information recording medium, de-interleaving the read extra parity data block, and obtaining at least one extra parity; generating an extra ECC block, by combining an extra ECC data block generated from an ECC block for the data that is to be reproduced, with the at least one extra parity and performing error correction on the extra ECC block; updating an extra ECC data block obtained from the error-corrected extra ECC block to a corresponding ECC block; and performing error correction on the updated ECC block.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Figure 1:
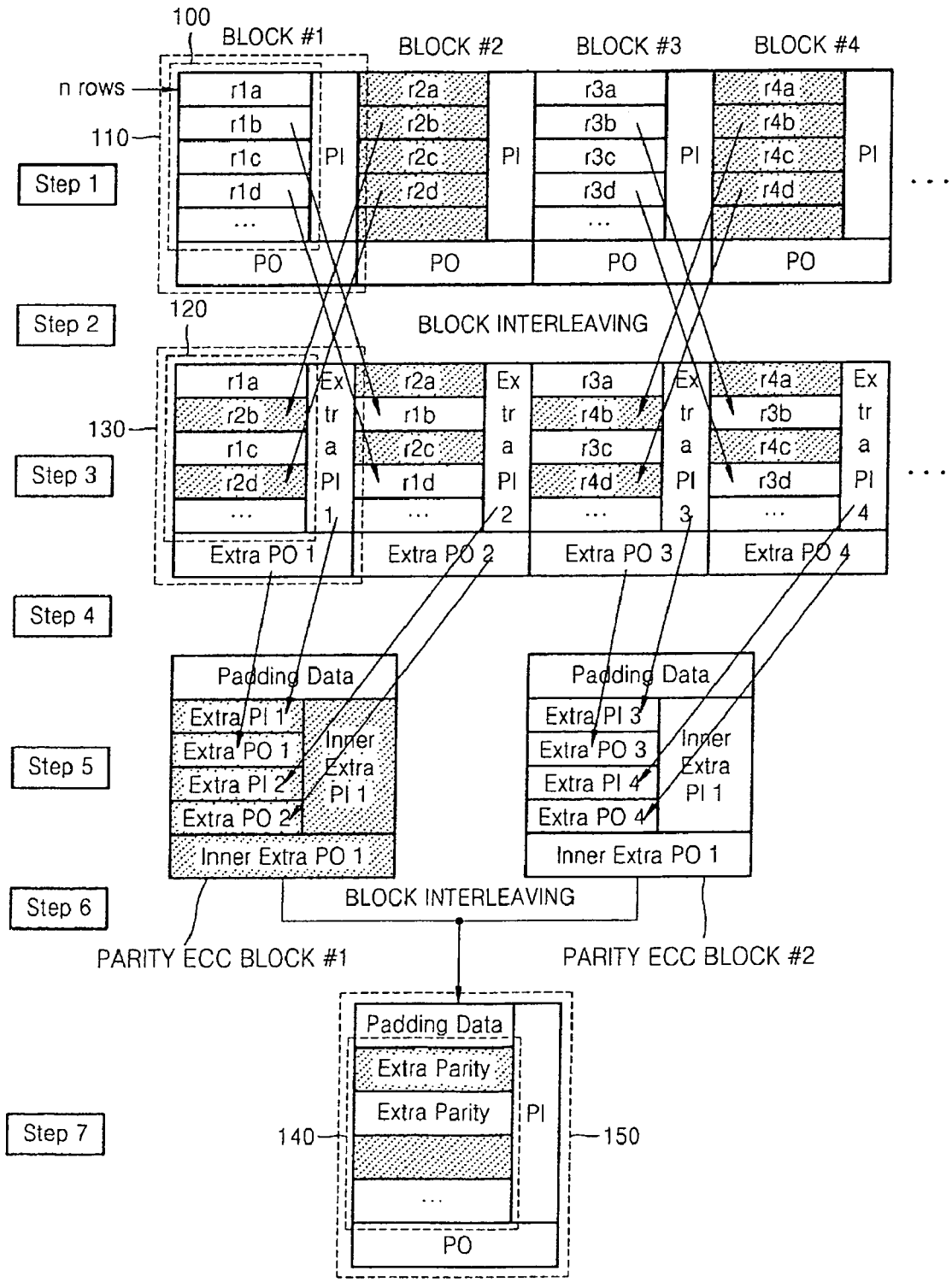
FIG. 1 is a view for explaining extra error correction coding (ECC) according to an embodiment of the present invention.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

In order to avoid deterioration in data reliability while ensuring reproduction compatibility with an existing standardized ECC format, an embodiment of the present invention provides an information recording medium to which extra ECC is applied, wherein user data that is to be recorded is recorded in existing standardized ECC blocks. Extra parity data are blocks generated for additional error correction of the ECC blocks and extra ECC management information for managing the extra parity data blocks are stored in the information recording medium. Also, aspects of the present invention provide an extra ECC-based recording/reproducing apparatus for recording/reproducing data in/from an information recording medium using the extra ECC.

FIG. 1 is a view for explaining a method for generating extra parities and extra parity ECC blocks in a Reed-Solomon Product Code (RSPC) format of a DVD, according to an embodiment of the present invention. Referring to FIG. 1, steps 1, 3, 5, and 7 represent operations for generating ECC blocks in the RSPC format, which is an existing standardized ECC format.

In step 1, four blocks #1, #2, #3 and #4 are prepared. Each of the blocks #1, #2, #3 and #4 is an ECC block 110 including user data 100 and to which an inner parity PI and an outer parity PO are added. For example, the block #1 110 is an ECC block in which an inner parity PI and an outer parity PO are added to the user data 100.

Step 2 represents an operation for performing block interleaving in a unit of N rows with respect to the user data 100 of the ECC block #1 110 prepared in step 1. In the example illustrated in FIG. 1, rows of even frames of the block #1 110 are exchanged with rows of even frames of the block #2. Rows of even frames of the block #3 are exchanged with rows of even frames of the block #4. For example, a row 'r1b' of the block #1 110 is exchanged with a row 'r2b' of the block #2, and a row 'r3b' of the block #3 is exchanged with a row 'r4b' of the block #4.

In step 3, the ECC blocks #1, #2, #3 and #4 are converted into interleaved user data blocks 120 with an existing RSPC format by block interleaving. Extra parities PI 1 and PO 1 are added to the interleaved user data blocks 120 as extra parities of an extra ECC Block 130. For example, in FIG. 1, by adding the extra parities PI 1 and PO 1 to the interleaved user data block 120 (hereinafter, referred to as an 'extra ECC data block'), the extra ECC block #1 130 is generated.

In step 4, one or more extra parities PI 1 and PO 1 generated in step 3 are collected.

In step 5, a plurality of ECC blocks (i.e., parity ECC blocks #1 and #2) with the existing RSPC format are generated using the extra parities PI 1 and PO 1 collected in step 4. As shown, padding data is added, and an Inner Extra PI 1 and an Inner Extra PI 1 is added for each parity ECC block #1 and #2 having the extra parities PI 1 and PO 1 instead of interleaved user data/extra ECC data block 120.

In step 6, block interleaving is performed on the parity ECC block #1 and #2 generated in step 5, thereby generating a user block of the extra parities PI 1 and PO 1 from different parity ECC blocks #1 and #2. The block interweaving as shown is of a same pattern as in step 2 such that the extra parities PI 1, PO 1, PI 2, PO 2, PI 3, PO 3, PI 4, and PO 4 become an ECC block of extra parities PI 1, PO 3, PI 2, PO 4 instead of user data, and another ECC block of PI 3, PO 1, PI 4, and PO 2 of user data.

In step 7, an ECC block 150 with the existing RSPC format is generated using the user block (i.e., the interleaved extra parities PI 1, PO 1, PI 2, PO 2, PI 3, PO 3, PI 4, and PO 4) generated in step 6. That is, the extra parity ECC block 150 is generated using an extra parity data block 140 having the extra parities PI 1, PO 1, PI 2, PO 2, PI 3, PO 3, PI 4, and PO 4. The ECC block 150 generated in step 7 is also referred to as the extra parity ECC block 150. The extra parity ECC block 150 further includes padding data, and extra parity PO, PI.

One reason the extra parities PI 1, PO 1, PI 2, PO 2, PI 3, PO 3, PI 4, and PO 4 generated in step 3 are constituted as an extra parity ECC block 150 in step 7 via steps 4, 5 and 6 is for enhancing reproduction reliability of the extra ECC block 130. This is because the extra parities PI 1, PO 1, PI 2, PO 2, PI 3, PO 3, PI 4, and PO 4 can be restored by inner extra parities PI and outer extra parities PO generated in step 5 when the extra ECC block 130 is not error-corrected. That is, since errors generated in the extra parity ECC 150 block of step 7 are distributed to two ECC blocks of step 5, an error correction probability increases. If steps 5 and 6 are skipped, the extra parity ECC block 150 can be directly generated in step 7 from the extra parities PI 1, PO 1, PI 2, PO 2, PI 3, PO 3, PI 4, and PO 4 generated in step 3 in another aspect of the invention.

Hereinafter, an example of a user data recovery method using the extra parities PI 1, PO 1, PI 2, PO 2, PI 3, PO 3, PI 4, and PO 4 will be described in detail according to an aspect of the invention. Generally, burst errors (such as scratches) are generated in a track direction. Approximately 1.5 to 5 ECC blocks are recorded in each track. For the example, the following assumptions are made. However, it is understood that aspects of the invention can be utilized with other assumptions.

Assumption 1: a maximum burst error correction length of a DVD RSPC format is about 6.4 mm (16 rows).

Assumption 2: burst errors corresponding to a length of about 12.8 mm (32 rows) are generated in a track direction.

Assumption 3: no other error is generated except for burst errors.

Assumption 4: an ECC block #1 and an ECC block #2 are recorded in a track.

If the burst errors of the above assumption 2 are not divided so as to correct two ECC blocks, at least one of the two ECC blocks cannot be error-corrected. If an ECC block which cannot be error-corrected is the ECC block #1 110, the user data 100 included in the ECC block #1 110 is recovered as follows. A drive system (not shown) recognizes, on the basis of error correction results of the ECC block #1 110 and the ECC block #2, a fact that the ECC block #1 110 cannot be corrected but that ECC block #2 can be corrected. The drive system reproduces the extra parity ECC block 150 in which the extra parities PI 1, PO 1, PI 2, PO 2, PI 3, PO 3, PI 4, and/or PO 4 corresponding to the ECC block #1 110 and the ECC block #2 are recorded, and obtains the extra parities PI 1, PO 1, PI 2, PO 2, PI 3, PO 3, PI 4, and/or PO 4.

Block interleaving is performed on the user data 100 of the ECC blocks #1 and #2 which are subjected to error correction, as in step 2 of FIG. 1. Two interleaved blocks 120 are thus generated. The extra parities PI 1, PO 1, PI 2, PO 2, PI 3, PO 3, PI 4, and/or PO 4 recorded in the extra parity data block 140 are obtained from the extra parity ECC block 150 and are disposed to the corresponding locations of the parity ECC blocks #1 and #2 as in step 5, so that two parity ECC blocks

1 and #2 are generated. The extra ECC blocks 130 are subjected to error correction and user data of the extra ECC blocks 130 is de-interleaved in an inverse order of step 2, so that user data 100 of the ECC blocks #1 and #2 is recovered and the parities PI 1, PO 1, PI 2, PO 2, PI 3, PO 3, PI 4, and/or PO 4 of the parity ECC block #1 and #2 are also recovered.

The user data 100 is recovered for the following reasons. The user data of the ECC block #2 is already corrected, and errors included in the user data 100 of the ECC block #1 110 are divided into two blocks interleaved in step 2, by using block interleaving. Accordingly, each of the two interleaved ECC blocks #1, #2 120 has, at most, errors in 16 rows. Since the DVD RSPC format can correct PI errors corresponding to 16 rows by erasure correction in a PO direction, both of the two interleaved ECC blocks 120 can be corrected. Similarly, the user data of the parity ECC block #2 shown in step 5 is already corrected, and errors included in the extra parities of the parity ECC block #1 are divided into two blocks interleaved in step 6, by using block interleaving. Accordingly, each of the two interleaved ECC blocks #1, #2 forming the extra parity ECC block 150 has, at most, errors in 16 rows. Since the DVD RSPC format can correct PI errors corresponding to 16 rows by erasure correction in a PO direction, both of the two interleaved parity ECC blocks #1, #2 can be corrected to obtain the extra parities PI 1, PO 1, PI 2, PO 2, PI 3, PO 3, PI 4, and/or PO 4.

Figure 2:
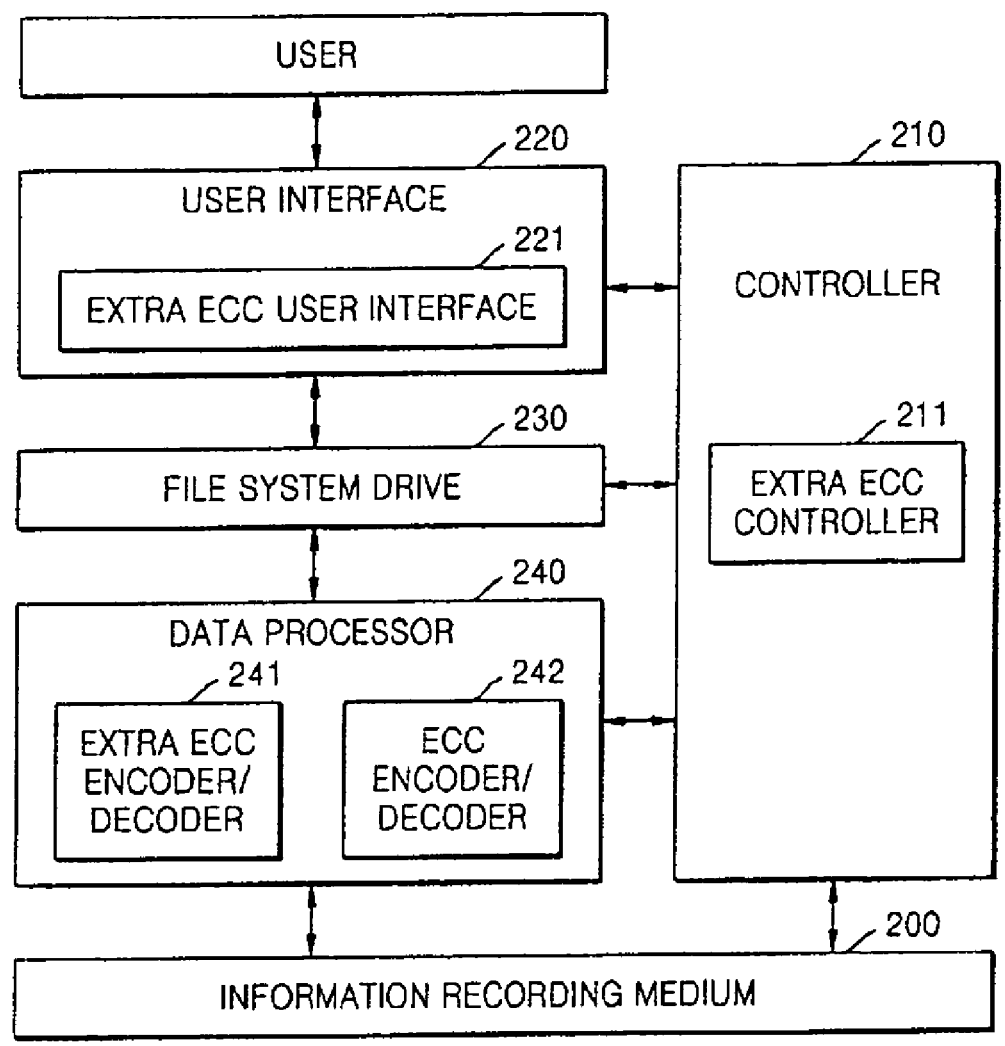
FIG. 2 is a block diagram of an apparatus for recording/reproducing data in/from an information recording medium to which the extra ECC is applied, according to an embodiment of the present invention.

FIG. 2 is a block diagram of an apparatus for recording and/or reproducing data in/from an information recording medium to which extra ECC is applied, according to an embodiment of the present invention. The recording/reproducing apparatus includes a controller 210 for controlling the components of the recording/reproducing apparatus. The controller 210 includes an extra ECC controller 211 that controls the components to perform extra ECC according to the present invention. A user interface 220 provides an interface with a user and which includes an extra EEC user interface 221. A file system drive 230 manages a file system of user data that is to be recorded on the information recording medium 200. A data processor 240 performs error correction of data that is to be recorded on the information recording medium 200 under the control of the controller 210 and for performing error correction of data so as to apply the extra ECC process according to an embodiment of the present invention. However, it is understood that other components, such as an optical pickup or a display, can be added instead of or in addition to the shown components. Moreover, the user interface 221 can include a display and/or a keyboard for use in allowing information to be communicated with respect to a user.

The data processor 240 includes an extra ECC encoder/decoder 241 and an ECC encoder/decoder 242. The ECC encoder/decoder 242 encodes user data into an ECC block in order to record the user data in the information recording medium 200, and decodes an ECC block read from the information recording medium 200. The extra ECC encoder/decoder 241 is for applying the extra ECC process according to an embodiment of the present invention to data that is to be recorded on the information recording medium 200.

Figure 3:
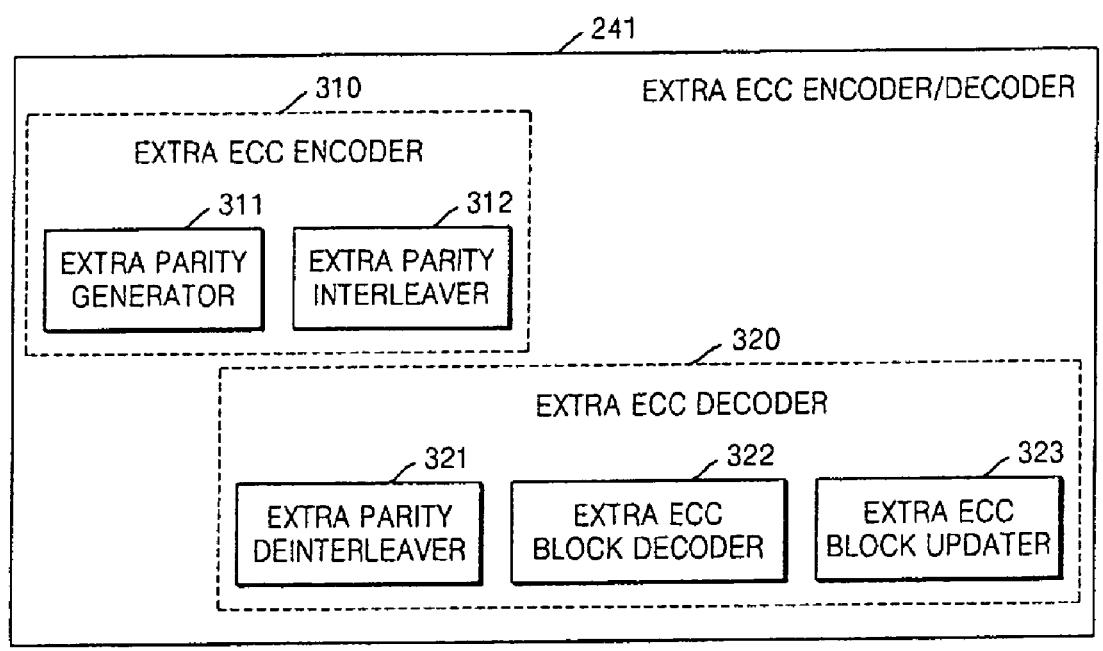
FIG. 3 is a detailed block diagram of an extra ECC encoder/decoder illustrated in FIG. 2.
Figure 19:
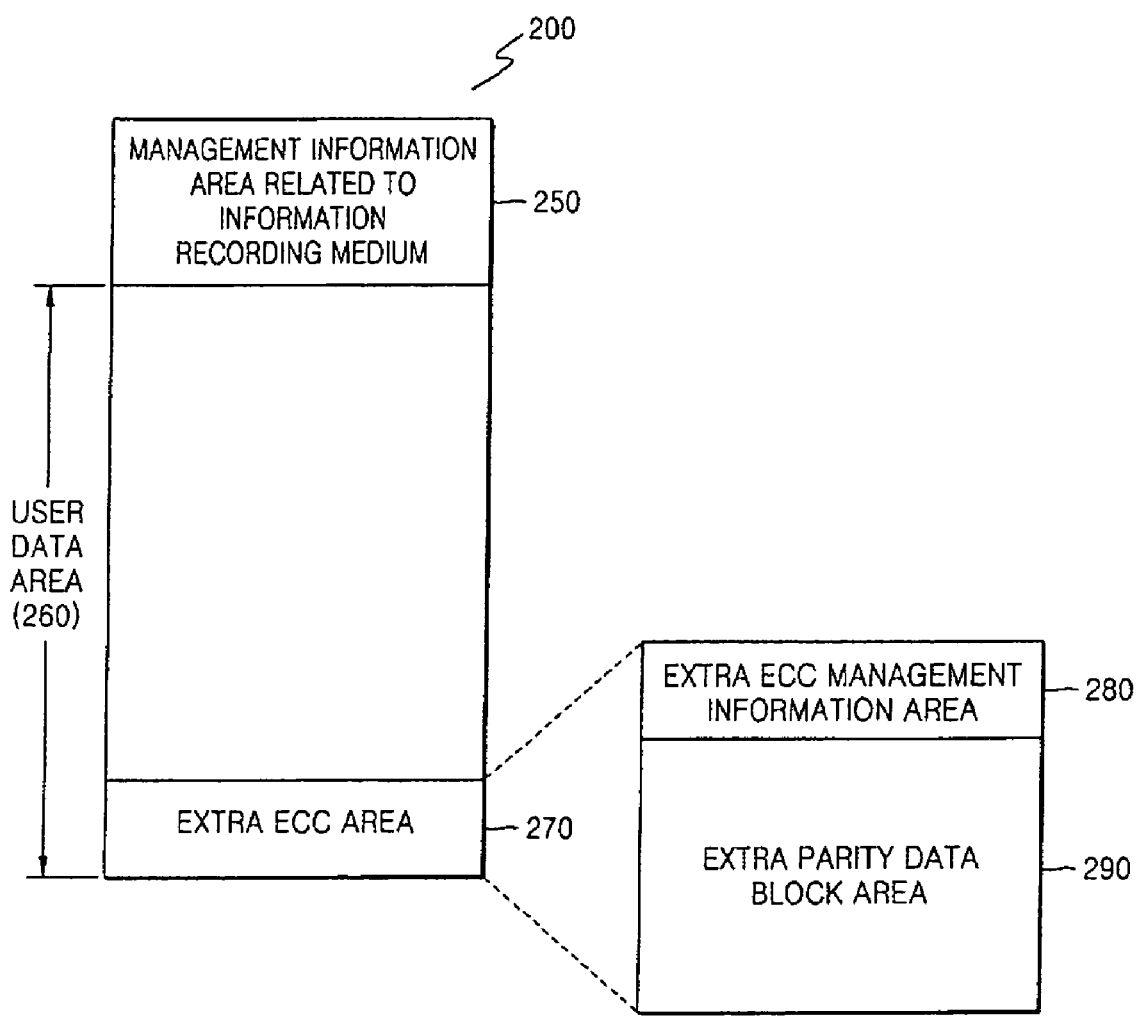
FIG. 19 is a view for explaining an information recording medium according to an embodiment of the present invention.

A detailed structure of an example of the extra ECC encoder/decoder 241 is illustrated in FIGS. 1, 3, and 19. The extra ECC encoder 310 includes an extra parity generator 311 and an extra parity interleaver 312. The extra parity generator 311 generates an extra ECC data block 120 from an ECC block 110 obtained by encoding user data, and generates the extra ECC block 130 by adding the extra parity PO 1, PI 1 to the extra ECC data block 120. The extra parity interleaver 312 collects the extra parities PO 1, PI 1, PO 2, PI 2, PO 3, PI 3, PO 4, PI 4 of one or more of the extra ECC blocks 130. For example, the interleaver 312 collects N extra ECC blocks 130 generated by the extra parity generator 311, performs interleaving according to a predetermined interleaving method, and generates the extra parity data block 140. Then, by performing error correcting coding (ECC) on the extra parity data block 140 and adding parities to the result of error-correction, the extra parity ECC 150 block is generated.

While not required in all aspects, when data is recorded, the extra parity ECC block 150 is recorded. In order to increase reproduction reliability of the extra parities, an extra parity ECC block 150 obtained by performing ECC on data having extra parities is recorded. When decoding is performed using the extra ECC process, since the decoding is actually performed on the extra parities, it is necessary to record such extra parities by using an arbitrary format in an information recording medium 200 in order to utilize the extra ECC block 130. Accordingly, in order to apply the extra ECC block 130, extra parities or extra parity data blocks 140 are recorded on the information recording medium 200. In the following description, as data is recorded on the information recording medium 200 so as to apply extra ECC block 130, the terms 'extra parities', 'extra parity data blocks', and 'extra parity ECC blocks' are used interchangeably.

The extra ECC decoder 320 includes an extra parity deinterleaver 321, an extra ECC block decoder 322, and an extra ECC block updater 323. The extra parity deinterleaver 321 deinterleaves an extra parity ECC block 150 obtained by performing error correction on an extra parity ECC block 150 read from the information recording medium 200, according to a predetermined deinterleaving method, and extracts N corresponding extra parities (i.e., extra parities PO 1, PI 1 PO 2, PI 2, PO 3, PI 3, PO 4, PI 4), when data is reproduced.

The extra ECC block decoder 322 generates the extra ECC data block 120 from an ECC block that is to be reproduced, combines extra parities which correspond to the ECC block among N extra parities extracted by de-interleaving the extra parity data block 140 of an extra parity ECC block 150 corresponding to the ECC block. With the extra ECC data block 120, the extra ECC block decoder 322 forms the extra ECC block 130, and performs error correction on the extra ECC block 130.

The extra ECC block updater 323 updates the extra ECC data block 120 in the extra ECC block 130 corrected by the extra ECC block decoder 322, to a corresponding ECC block such as the ECC block #1 110.

The controller 210 controls the operation of the respective components of the recording/reproducing apparatus. In particular, the controller 210 includes the extra ECC controller 211 for controlling functions related to the application of the extra ECC according to an embodiment of the present invention. It is understood that the controller 211 can be on a common processor as the controller 210, or operate separately under the control of controller 210.

The extra ECC controller 211 controls and manages recording/reproducing related to extra ECC functions.

When user data is recorded, if the user data has not been determined in advance whether extra ECC is applied and if an application rate of the extra ECC has been not set in advance, the extra ECC controller 211 determines whether an extra ECC is applied and sets an application rate of the extra ECC, using user interface 221. If the extra ECC is applied, the extra ECC controller 211 controls the components so that an extra ECC area 270 for recording the extra parity ECC blocks 150 and extra ECC management information is assigned, and manages the assigned area 270 on the information recording medium 200. Also, the extra ECC controller 211 controls the generation of the extra parity ECC block 150 according to the application rate of the extra ECC when the user data is recorded, and manages the recording of the extra parity ECC block 150 and the update and recording of the extra ECC management information. If the extra ECC is not to be applied, the user data is recorded using the conventional ECC process.

When the user data is reproduced, the extra ECC controller 211 determines whether the information recording medium 200 is an information recording medium to which extra ECC is applied. If the information recording medium 200 has the extra ECC process, the extra ECC controller 211 determines whether the user data must be reproduced using the extra ECC block 130 using the user interface 221, if it has been not determined in advance whether the user data must be reproduced using the extra ECC block 130. If the user data is reproduced using the extra ECC block 130, the extra ECC controller 211 reproduces extra ECC management information, and controls reproducing of extra parity ECC blocks 150 for ECC blocks that are to be reproduced from the extra ECC management information and controls error correction of the ECC blocks using extra parities. If the user data is not reproduced with the extra ECC process, the user data is read using conventional ECC decoding.

The user interface 220 provides an interface with a user, when data is recorded on the information recording medium 200 or when data is reproduced from the information recording medium 200. Particularly, the user interface 220 further includes the extra ECC user interface 221 for applying extra ECC. The extra ECC user interface 221 provides a user interface which is for determining whether extra ECC is applied to the information recording medium 200, and for determining an application rate of the extra ECC, when data is recorded on the information recording medium 200. When data is reproduced from the information recording medium 200, the extra ECC user interface 221 provides a user interface for determining whether the data is reproduced using extra ECC if the information recording medium 200 is an information recording medium to which extra ECC is applied. It is understood that the user interface 220 can be omitted in other aspects of the invention.

The file system drive 230 manages a file system of user data which is recorded on the information recording medium 200. By way of example, the file system drive 230 can perform some of the functions of the extra ECC controller 211 and/or of functions of the extra ECC encoder/decoder 241.

Also, in the recording/reproducing apparatus for performing extra ECC, the extra ECC encoder/decoder 241 includes an extra parity generator 311, an extra parity interleaver 312, an extra parity de-interleaver 321, an extra ECC block decoder 322, and an extra ECC block updater 323, thereby implementing the extra ECC. As such, by adding components required for extra ECC to an existing apparatus or system, information recording media to which extra ECC is applied, as well as existing information recording media to which extra ECC is not applied, can be used.

Also, the extra parity data block 140 is generated from at least one ECC block for the user data, however, the present invention is not limited to this. The basic reason of recording an extra parity data block 140 in an information recording medium 200 together with user data 100 is to restore the user data 100 using extra parities included in a separate extra parity data block 140 for restoring the user data 100 when the user data 100 cannot be restored by an existing error correction system. Accordingly, aspects of the present invention construct an extra ECC data block 120 and generate an extra ECC block 130, by extracting a part of data from user data itself or from data resulting from transforming user data through a series of process steps (such as scrambling), and also can collect extra parities of the extra ECC block 130 and construct an extra parity data block 140.

Figure 4:
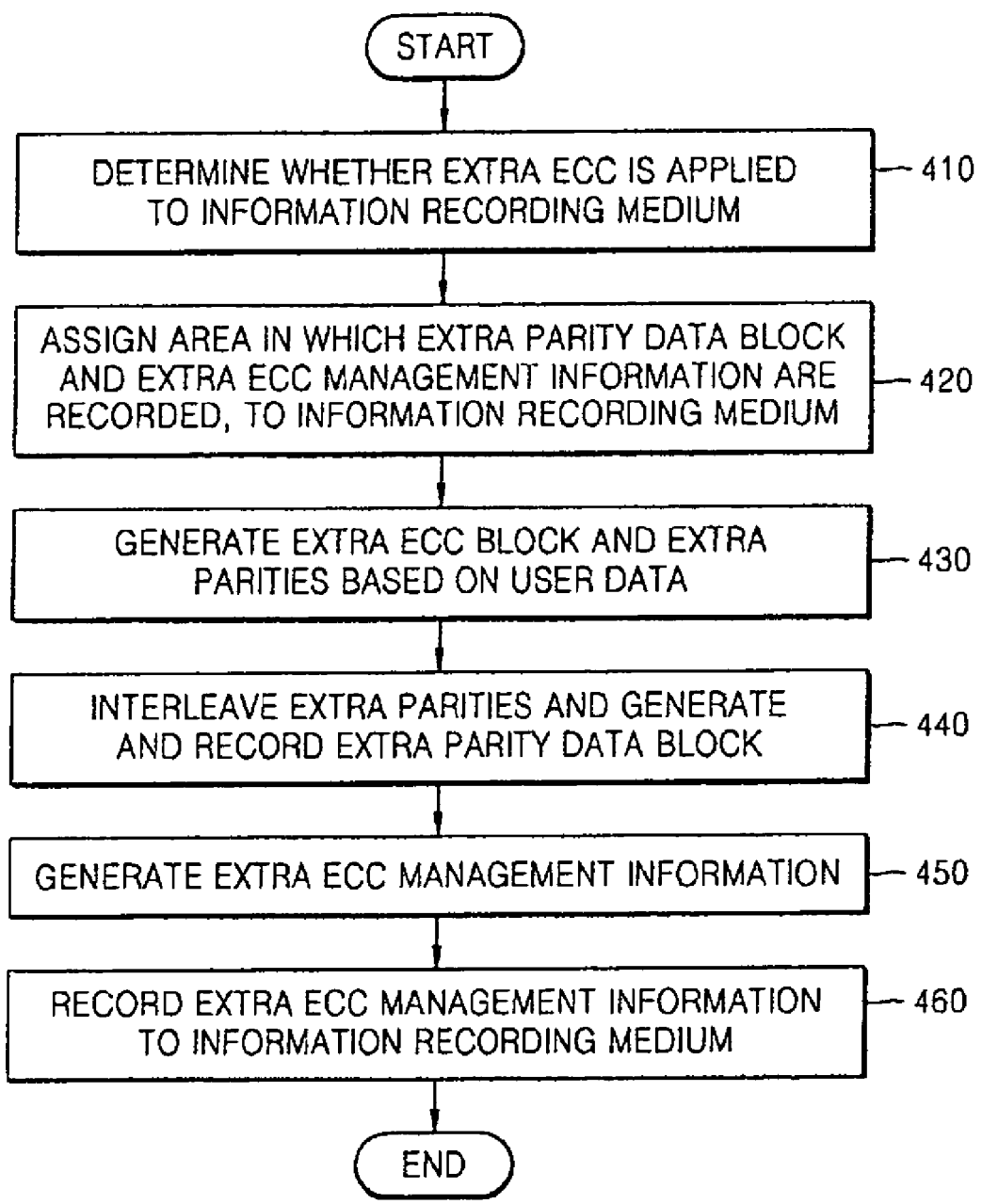
FIG. 4 is a flowchart illustrating a method of recording data in an information recording medium using the extra ECC, according to an embodiment of the present invention.

FIG. 4 is a flowchart illustrating a method of recording data in an information recording medium using the extra ECC, according to an embodiment of the present invention. It is determined whether extra ECC is applied to an information recording medium (operation 410). It is determined whether data must be encoded using extra ECC when the data is recorded on the information recording medium. If it is determined that extra ECC is applied, an application rate of the extra ECC is decided.

The greater the application rate of the extra ECC, the wider area required for recording an extra parity data block 140. For example, if the application rate is 1/N, an extra parity data block 140 is generated from N user data blocks (where N is an integer). In the case of DVD RSPC, since the corresponding ECC application rate is about 13%, extra parities for N blocks are about N*13%. The extra parities of N*13% are subjected to ECC encoding so that N*13% does not exceed 87%. Therefore, in the shown example, N is a maximum of 6. If only outer parities PO are used as extra parities, N can increase. In the case of inner parities PI, inner parities PI can be used in step 3 of FIG. 1 in order to restore inner parities PI generated in step 1 of FIG. 1. Therefore, since an area corresponding to 1/6 of the entire user data is required, it is preferable, but not required, to reduce a user data area and assign a recordable area (such as near the outer circumference of a disc) to record the extra parity ECC blocks 150. However, other locations can be used. Moreover, the N can be other than 6, such as for other disc formats.

An area 270 in which the extra parity data block 140 and the extra ECC management information will be recorded is assigned to the information recording medium (operation 420). It is preferable, but not required, to store area location information and/or size information after assignment.

An extra ECC block 130 and extra parities are generated based on user data 100 (operation 430). An extra parity data block 140 is generated by interleaving the extra parities of the extra ECC block 130, and is recorded in an assigned area of the information recording medium 200 (operation 440). In order to ensure reproduction reliability, it is preferable, but not required, to record an extra parity ECC block 150 generated by performing ECC on the extra parity data block 140. An example of the way in which the extra ECC block 130, the extra parities, the extra parity data block 140, and the extra parity ECC block 150 are generated is described above with reference to FIG. 1.

Extra ECC management information is generated (operation 450). The extra ECC management information includes information indicating a mapping relation between information on a location in which ECC blocks for user data are recorded and information on a location in which extra parity data blocks 140 corresponding to the user data are recorded, and information regarding extra ECC. The information regarding extra ECC includes information indicating whether extra ECC is applied, information indicating an application rate of extra ECC, information about the location and/or size information of an area assigned to record extra parity data blocks 140 and extra ECC management information, etc.

The extra ECC management information is recorded on the assigned area, such as area 280, of the information recording medium (operation 460).

Figure 5:
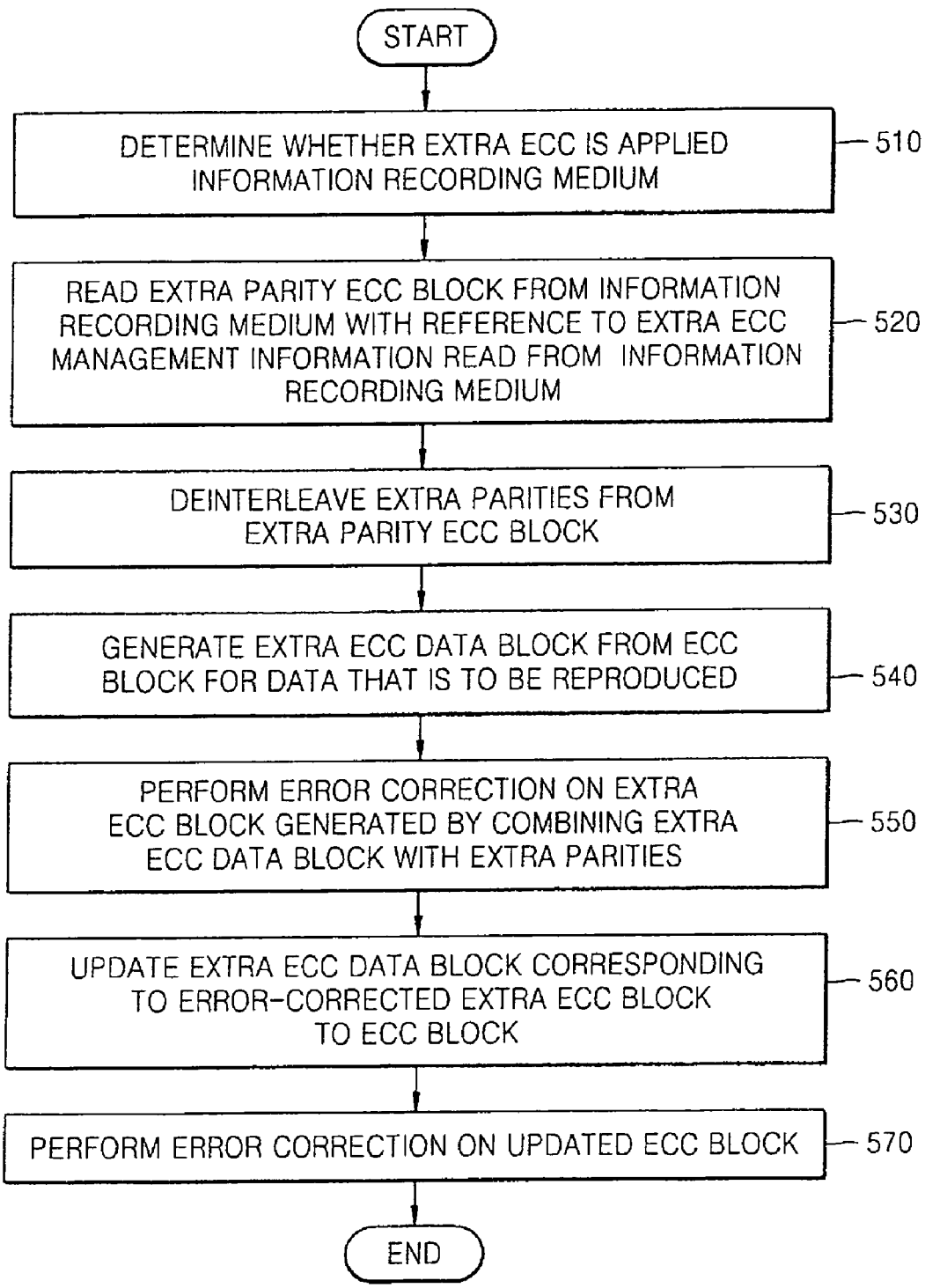
FIG. 5 is a flowchart illustrating a method of reproducing data from an information recording medium using the extra ECC, according to an embodiment of the present invention.

FIG. 5 is a flowchart illustrating a method of reproducing data from an information recording medium using the extra ECC, according to an embodiment of the present invention. It is determined whether extra ECC has been applied to an information recording medium (operation 510). That is, it is determined whether data has been recorded using extra ECC in an information recording medium. It is also determined whether the data must be reproduced using extra ECC from the information recording medium due to, by way of example, an inability to recover one of the ECC blocks.

If it is determined that the data must be reproduced using extra ECC from the information recording medium, the extra ECC management information is read from a predetermined area of the information recording medium, such as area 280. The extra ECC management information includes a mapping relation between information on a location in which user data is recorded and information on a location in which the corresponding extra parity data blocks 140 or extra parity ECC blocks 150 are recorded. An extra parity ECC block 150 is read from the information recording medium 200 with reference to the extra ECC management information (operation 520).

Then, an extra parity data block 140 is obtained by performing error correction on the extra parity ECC block 150, and extra parities are obtained by de-interleaving the extra parity data block 140 (operation 530).

An extra ECC data block 120 is generated from an ECC block for data that is to be reproduced (operation 540). Successively, an extra ECC block 130 is generated by combining the extra ECC data block 120 with the extra parities, and error correction is performed on the extra ECC block 130 (operation 550). The extra ECC data block 120 corresponding to the error-corrected extra ECC block 130 is updated to an ECC block (operation 560). By performing error correction on the update ECC block, user data that is to be reproduced is obtained (operation 570).

Figure 6:
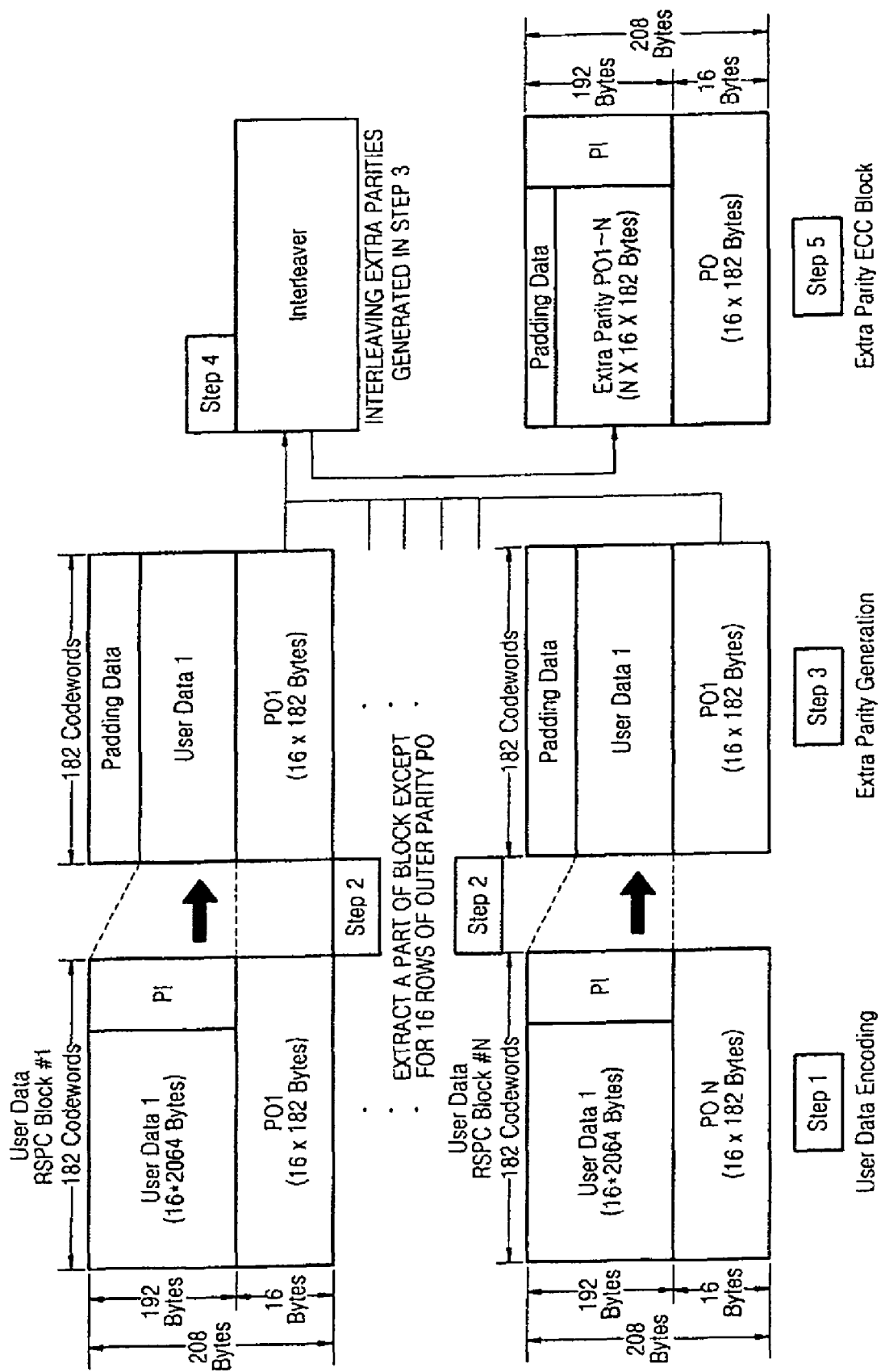
FIG. 6 is a concept view for explaining a process of generating an extra parity ECC block for DVD, according to an embodiment of the present invention.

FIG. 6 is a concept view for explaining a process of generating an extra parity ECC block 150 for a DVD, according to an embodiment of the present invention. Referring to FIGS. 3 and 6, the extra parity generator 311 extracts 192 upper rows including PI with respect to each of 11 ECC blocks (RSPC blocks) encoded by an ECC encoder (an RSPC encoder), and generates an extra ECC data block 120. Then, by adding 16 bytes of an extra parity to each column of the extra ECC data block 120, an extra ECC block 130 is generated.

The extra parity interleaver 312 mixes 11 extra parity PO blocks (16*182 bytes) included in the 11 extra ECC blocks with padding data, performs interleaving using a predetermined interleaving method, and generates 32 Kbytes of an extra parity data block 140. The extra parity data block 140 is encoded to an extra parity ECC block 150 by a general encoding process (such as data ID, or scrambling) by an ECC encoder.

Figure 7:
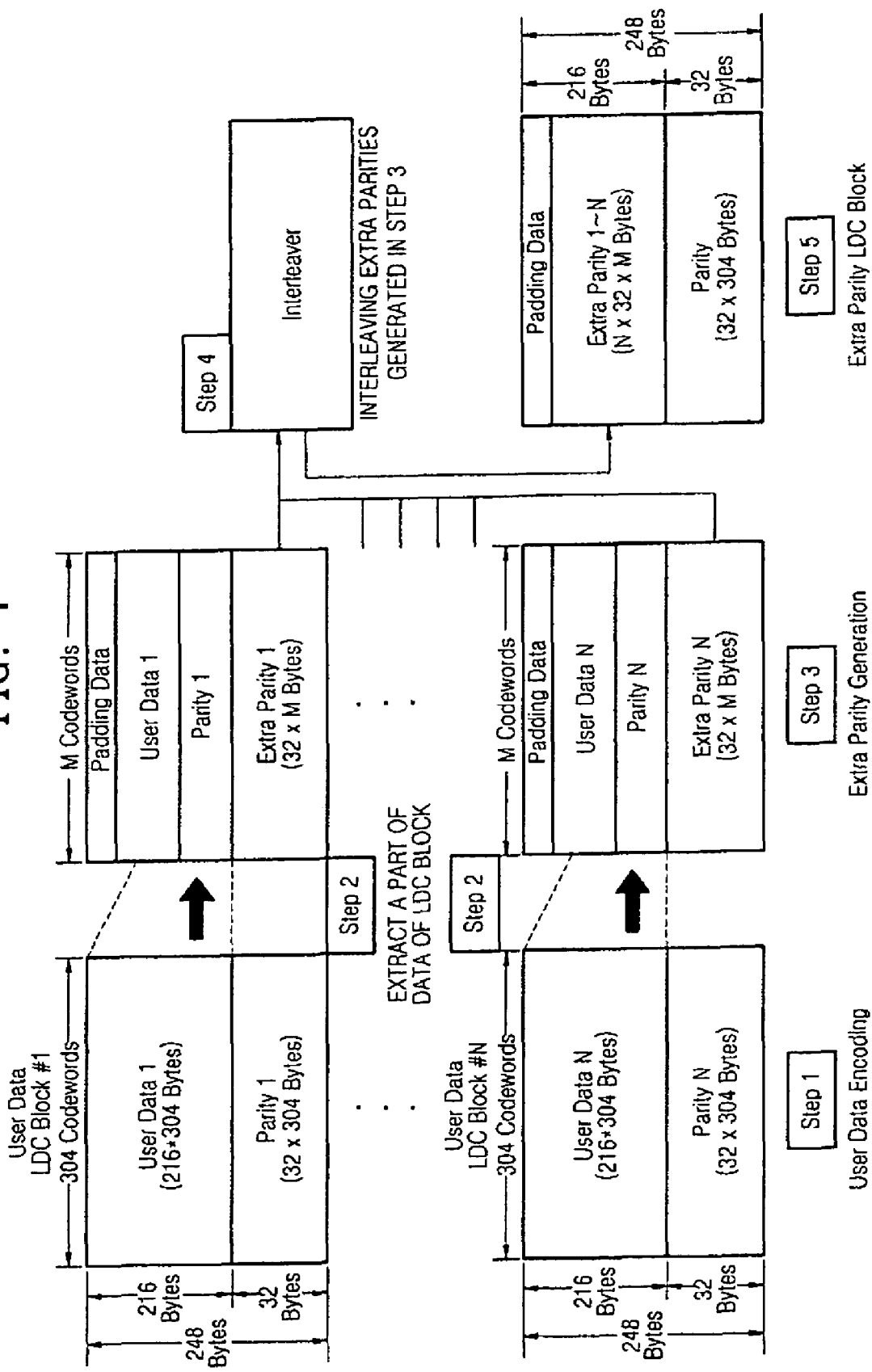
FIG. 7 is a concept view for explaining a process of generating an extra parity ECC block for Blu-ray discs (BDs), according to an embodiment of the present invention.

FIG. 7 is a concept view for explaining a process of generating an extra parity ECC block 150 for a BD, according to an embodiment of the present invention. As Long Distance Code (LDC) is a Basic data block instead of ECC, the terms ECC and LDC are used interchangeably to describe the use of the invention with the BD. Referring to FIGS. 3 and 7, the extra parity generator 311 extracts 248 rows (or some rows from among 248 rows for some columns from among 304 columns) including parities for each of 6 (M=304) ECC blocks (LDC blocks) encoded by an ECC encoder (an LDC encoder), and generates an extra ECC data block 120. Then, by adding 32 bytes of an extra parity to each column of the extra ECC data block 120, an extra ECC block 130 is generated. The extra parity interleaver 312 mixes 6 extra parities (32*304 bytes) included in 6 extra ECC blocks 130 with padding data, performs interleaving according to a predetermined interleaving method, and generates 64 Kbytes of an extra parity data block 140. The extra parity data block 140 is encoded to an LDC block (an extra parity LDC block like the extra parity ECC block 150) by using a general LDC encoding process (such as EDC or scrambling) by an LDC encoder.

Figure 11:
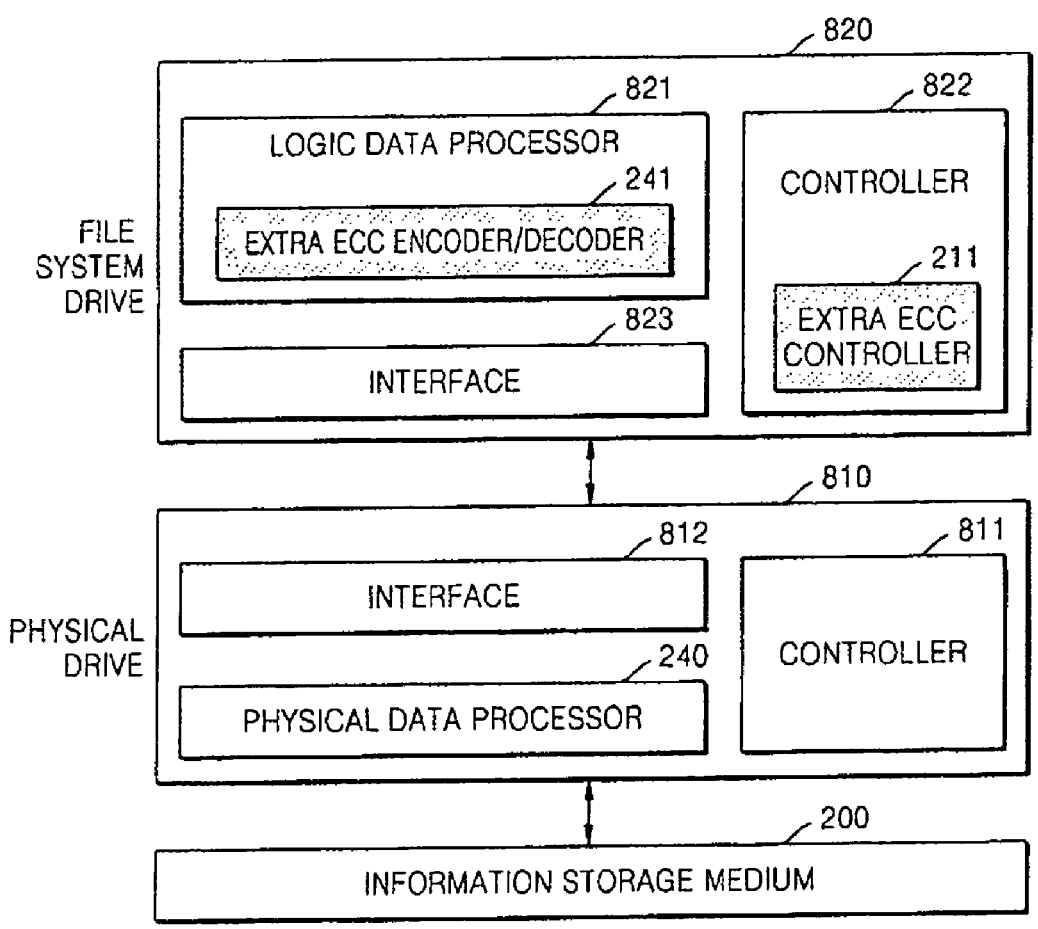
FIG. 11 is a block diagram of a recording/reproducing apparatus for performing the extra ECC by using a file system drive, according to an embodiment of the present invention.
Figure 14:
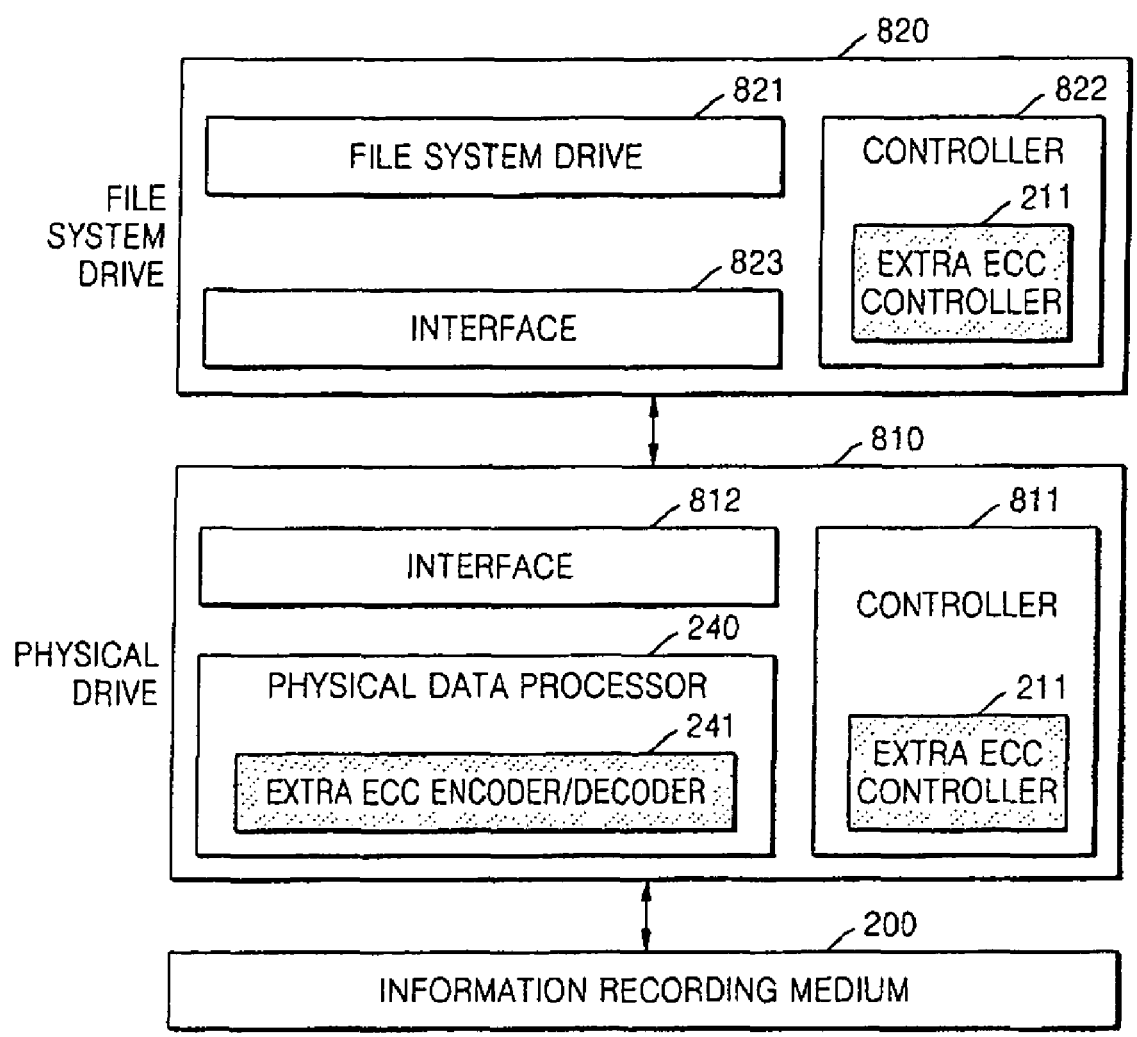
FIG. 14 is a block diagram of a recording/reproducing apparatus for performing the extra ECC by using a physical drive and a file system drive, according to an embodiment of the present invention.

Hereinafter, the information storage medium to which extra ECC is applied and a method of operating the recording/reproducing apparatus will be described. The operating method is classified into an operating method performed by a physical drive which will be described later with reference to FIG. 8, an operating method performed by a file system drive which will be described later with reference to FIG. 11, and an operating method performed by both the physical drive and the file system drive which will be described later with reference to FIG. 14, Recording/reproducing apparatuses illustrated in FIGS. 8, 11, and 14 correspond to cases where the configuration of the recording/reproducing apparatus illustrated in FIG. 2 is implemented according to functions of the physical drive and file system drive. That is, the recording/reproducing apparatuses illustrated in FIG. 8 correspond to a case where an extra ECC function performed by the recording/reproducing apparatus illustrated in FIG. 2 is implemented by the physical drive. FIG. 11 corresponds to a case where the extra ECC function is implemented by the file system drive 230 of FIG. 2. FIG. 14 corresponds to a case where the extra ECC function is implemented by both the physical drive and the file system drive 430 of FIG. 2.

The file system drive 230 manages a logic volume space corresponding to a user data area of the information recording medium 230, and manages user data and management information for managing user data including file system information. The physical drive executes a data recording command from the file system drive 230, records data in the information recording medium 230, and manages management information for managing the information recording medium 203.

Figure 8:
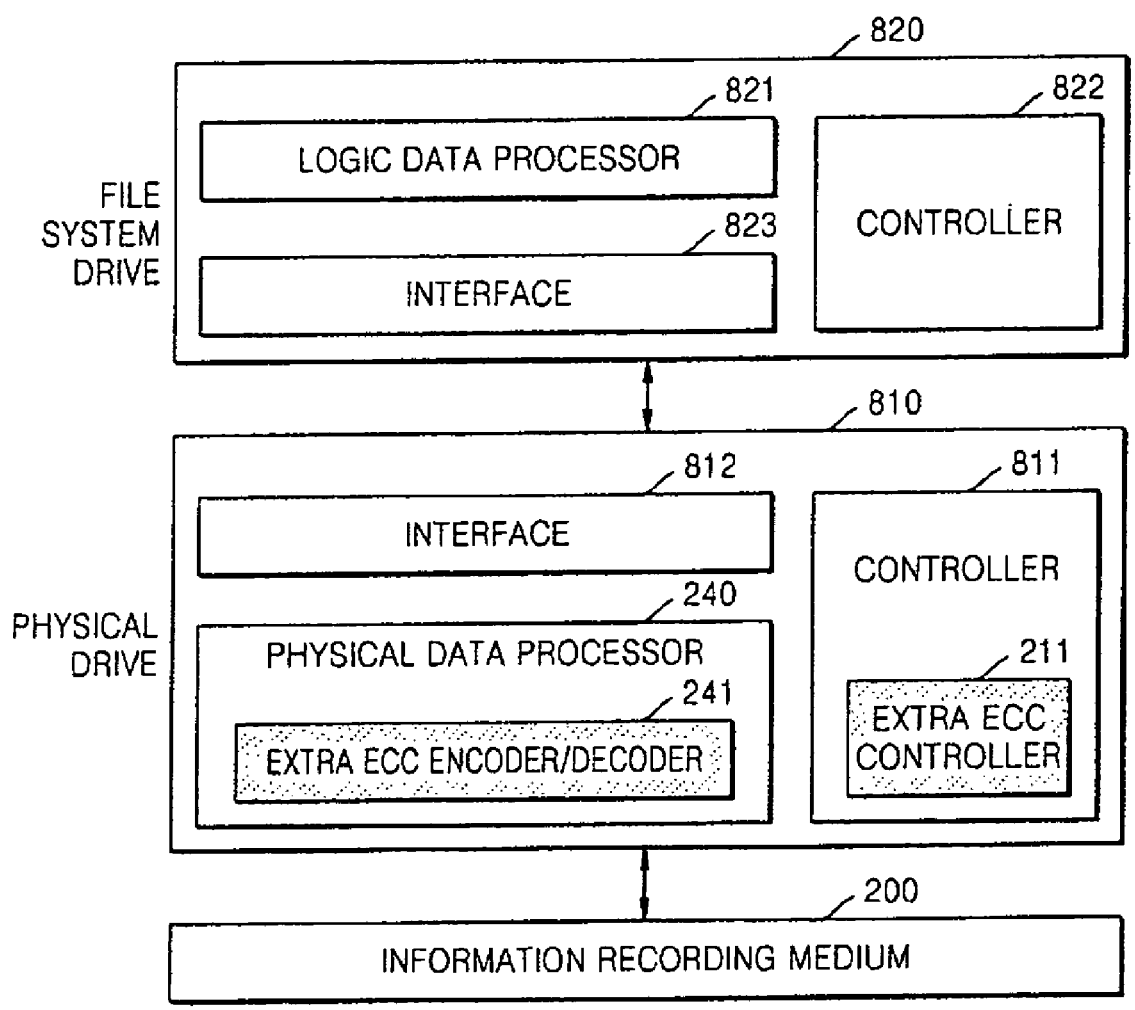
FIG. 8 is a block diagram of a recording/reproducing apparatus for performing the extra ECC by using a physical drive, according to an embodiment of the present invention.

The extra ECC operating method performed by the physical drive is described using FIG. 8. The extra ECC operating method performed by the physical drive, according to an aspect of the present invention, means that extra ECC is managed by the physical drive. Therefore, the file system drive 230 does not recognize a method of operating extra ECC, and operates a given information recording medium 200 without using extra ECC, as if operating an information storage medium 200 to which existing ECC is applied.

All functions added to an existing information recording medium, such as generating and recording/reproducing of extra parity data blocks 140 for extra ECC, error correction of ECC blocks using extra parities, assignment of areas in which extra parity data blocks 140 are recorded, generating/updating and recording/reproducing of extra ECC management information, and assignment of areas in which extra ECC management information is recorded, are managed by the physical drive.

Referring to FIG. 8, the recording/reproducing apparatus includes a file system drive 820 and a physical drive 810. The file system drive 820 includes a logic data processor 821 for performing data processing in the file system drive 820, a controller 822 for controlling components of the file system drive 820, and an interface 823 which provides an interface with the physical drive 810. The physical drive 810 includes a controller 811 for controlling components of the file system drive 820, an interface 812 for providing an interface with the file system drive 820, and a physical data processor 240 for performing data processing in the physical drive 810. The physical data processor 240 includes an extra ECC encoder/decoder 241 for encoding/decoding data using extra ECC. The controller 811 of the physical drive 810 controls the extra ECC encoder/decoder 241, and includes the extra ECC controller 211 for performing extra ECC.

Figure 9:
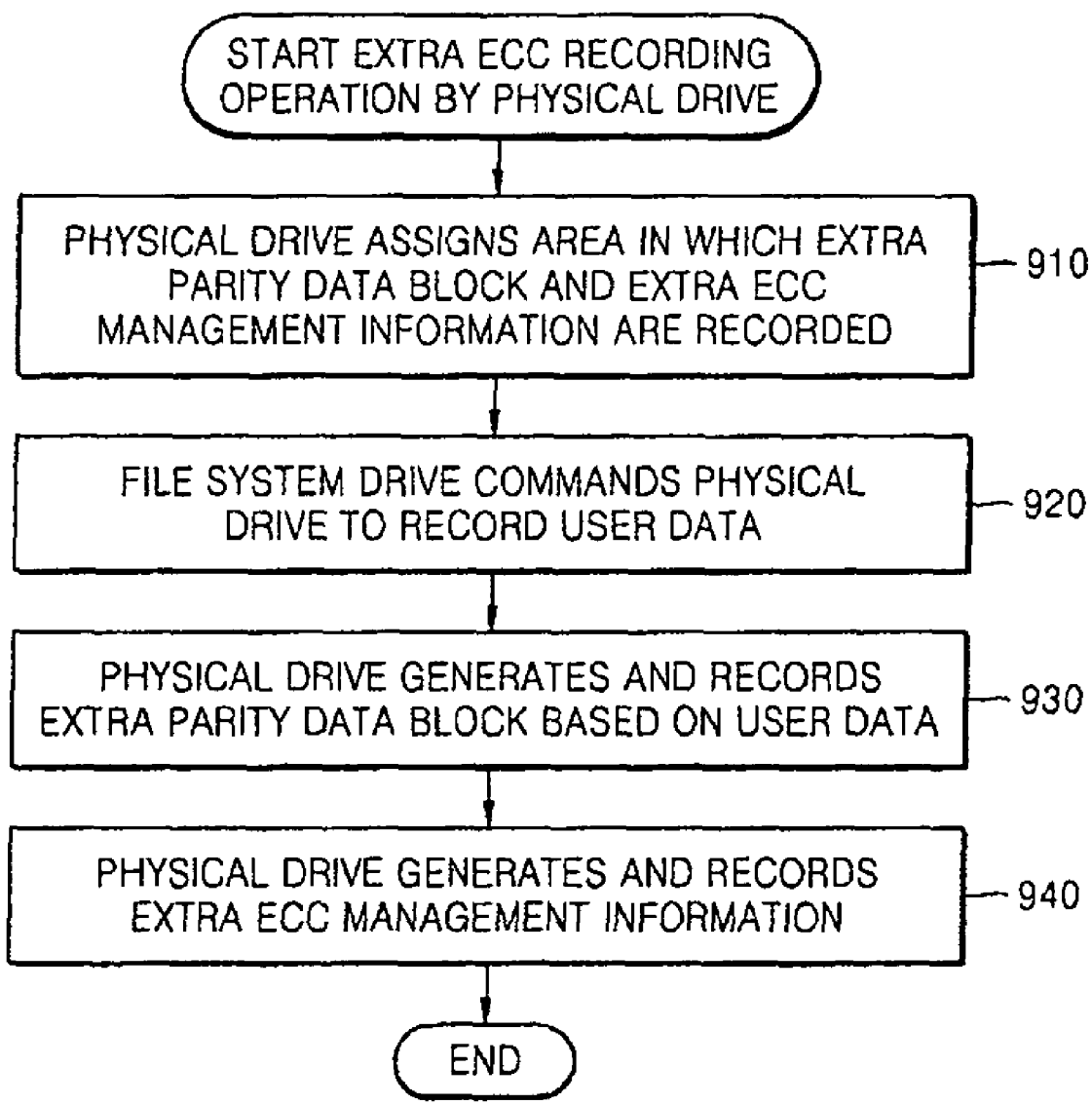
FIG. 9 is a flowchart illustrating a recording operation performed by the recording/reproducing apparatus illustrated in FIG. 8.

Hereinafter, a recording operation in which a recording/reproducing apparatus performs extra ECC by using the physical drive 810 will be described with reference to FIGS. 8 and 9. When an information recording medium 200 is loaded or installed in the physical drive 810, the physical drive 810 assigns an extra parity data block area 290 for extra parity data blocks 140 and an extra ECC management information area 280 for extra ECC management information to the information recording medium 200 (operation 910). Since the file system drive 820 does not recognize the extra ECC, the areas must be assigned outside a logic volume space. Since the logic volume space is an area in which data is recorded or managed by a recording command of the file system drive 820, the areas recorded and managed by the physical drive 810 must be separated from the logic volume space.

If the file system drive 820 outputs a user data recording command to the physical drive 810 (operation 920), the physical drive 810 records user data in response to the user data recording command of the file system drive 820, and simultaneously generates an extra parity data block 140 in the extra ECC encoder/decoder 241, under the control of the ECC controller 211, according to a predetermined extra ECC application rate, and records the extra parity data block 140 in an assigned area of the information recording medium 200 (operation 930).

Also, the extra ECC controller 211 generates extra ECC management information which includes extra ECC definition information and information indicating a mapping relation between location information in which user data is recorded and location information in which extra parity data blocks 140 for the user data are recorded, and records the extra ECC management information in an assigned area of the information recording medium 200 (operation 940).

Figure 10:
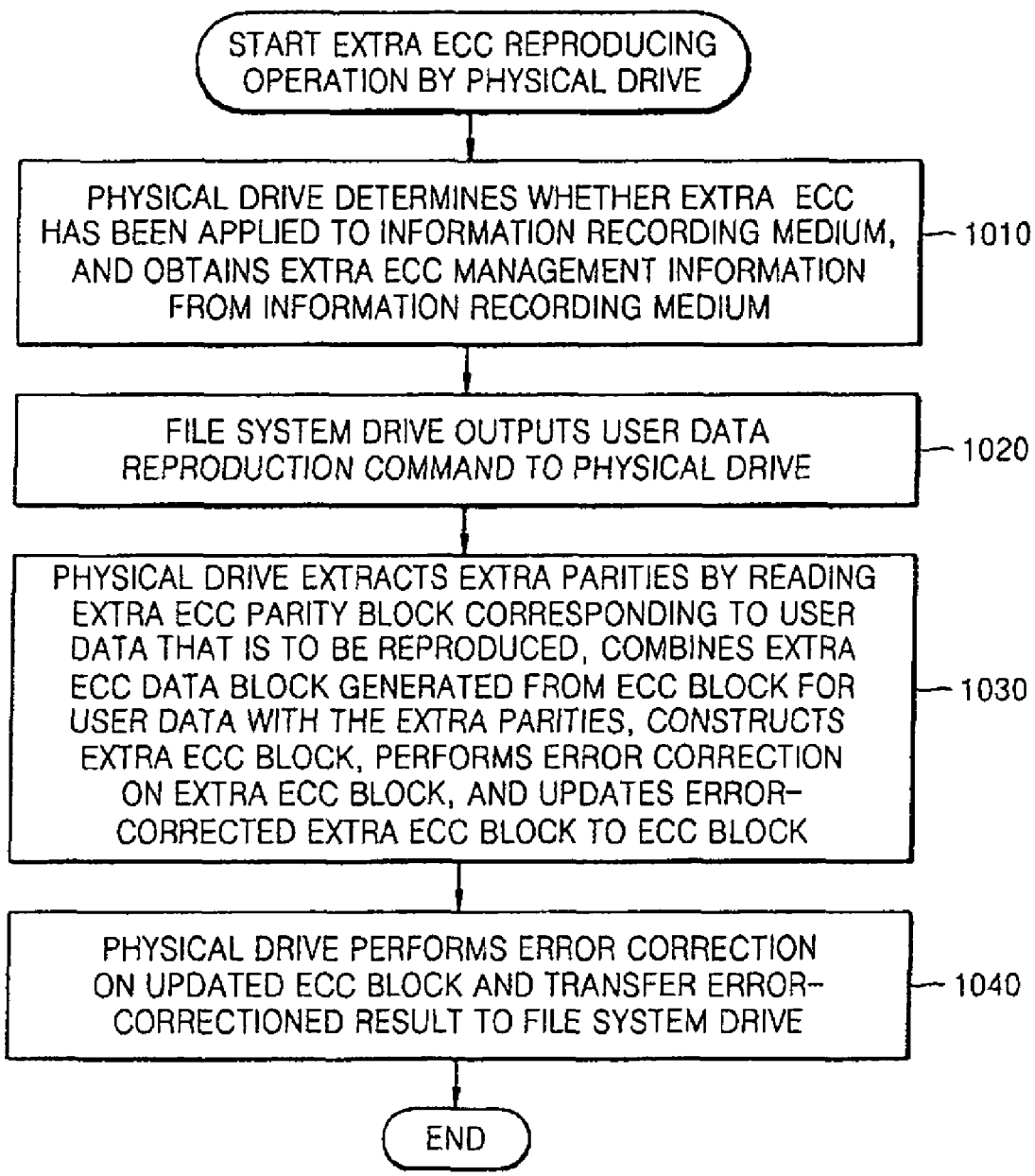
FIG. 10 is a flowchart illustrating a reproducing operation performed by the recording/reproducing apparatus illustrated in FIG. 8.

Hereinafter, a reproduction operation in which the recording/reproducing apparatus performs extra ECC by using the physical drive 810 will be described with reference to FIGS. 8 and 10. When data is reproduced from the information recording medium 200, the physical drive 810 determines whether extra ECC has been applied to the information recording medium 200. If extra ECC has been applied to the information recording medium 200, extra ECC management information is obtained from the extra ECC management information area 280 and is stored in an internal memory (such as RAM) of the physical drive 810 (operation 1010). If the file system drive 820 outputs a user data reproduction command to the physical drive 810 (operation 1020), the physical drive 810 accesses a location in which user data that is to be reproduced is recorded, using a command of the file system drive 820, and reproduces the user data. Simultaneously, the stored extra ECC controller 211 obtains from the extra ECC management information stored in the internal memory, information on a location in which an extra parity data block 140 connected with the location in which the user data is recorded is recorded, accesses the location in which the extra parity data block 140 is recorded, and reads an extra parity ECC block 150.

Under the control of the extra ECC controller 211, an extra ECC encoder/decoder 241 performs error correction on the extra parity ECC block 150, obtains an extra parity data block 140, and obtains extra parities corresponding to an ECC block for the user data from the extra parity data block 140. Also, the extra ECC encoder/decoder 241 generates an extra ECC data block 120 from an ECC block for user data that is to be reproduced, combines the extra ECC data block 120 with the extra parities, constructing an extra ECC block 130, performing error correction on the extra ECC block 130, and updates the error-corrected extra ECC block 130 to an ECC block (operation 1030). The ECC encoder/decoder 241, which is included in a physical data processor in the physical drive 810, performs error correction on the updated ECC block and transfers the resultant ECC block to the file system drive 820 (operation 1040).

A preferable structure of the information recording medium 200 for extra ECC, according to an aspect of the present invention, is illustrated in FIG. 19. Referring to FIG. 19, the information storage medium 200 is managed by the file system drive 820, and includes a user data area 260 in which user data and information (such as file system data or A/V management information) for managing the user data, are recorded; an information recording medium related management information area 250 managed by the physical drive; an extra ECC management information area 280 in which extra ECC management information is recorded; and an extra ECC area 270 including an extra parity data block area 290 in which extra parity data blocks 140 are recorded. That is, according to an embodiment of the present invention, the extra ECC management information area 280 for extra ECC and the extra parity data block area 290 for extra parity data blocks 140 are assigned to an existing information recording medium 200 and are managed by the physical drive.

Generally, in the conventional information recording medium 200, since the information recording medium related information management area 250 is used for its inherent purpose, a separate area 270 for extra ECC does not exist, actually, is not sufficient. For this reason, it is preferable, but not required, that an extra ECC area 270 is prepared in the user data area 260. That is, it is preferable that a part of the user data area 260 is used as the extra ECC area 270, and the remaining area is used as the user data area 260. As such, by applying extra ECC to the existing information recording medium 200 by changing the physical drive 810 without changing the file system drive 820 of the existing system, it is possible to maintain reproduction compatibility of an information recording medium 200 when the information recording medium 200 to which extra ECC is applied is loaded in an existing legacy system.

A method of operating extra ECC by using the file system drive 820, according to an embodiment of the present invention, means that extra ECC is managed and performed by the file system drive 820. That is, all functions added to an existing information recording medium 200 (such as generating and recording/reproducing of extra parity data blocks 140, restoring of user data in an ECC block using extra parities, assignment of areas in which extra parity data blocks 140 are recorded, generating/updating and recording/reproducing of extra ECC management information, assignment of areas in which extra ECC management information is recorded, etc.) are performed by the file system drive 820. The physical drive 810 has a function of transferring an ECC block subjected to ECC or error correction parities of the ECC block to the file system drive 820.

FIG. 11 is a block diagram of a recording/reproducing apparatus for performing extra ECC by the file system drive 820, according to an embodiment of the present invention. Referring to FIG. 11, the recording/reproducing apparatus includes a file system drive 820 and a physical drive 810. A logic data processor 821 of the file system drive 820 includes an extra ECC encoder/decoder 241 for encoding/decoding data using extra ECC. A controller 822 of the file system drive 820 controls the extra ECC encoder/decoder 241 and includes an extra ECC controller 211 for performing extra ECC.

Figure 12:
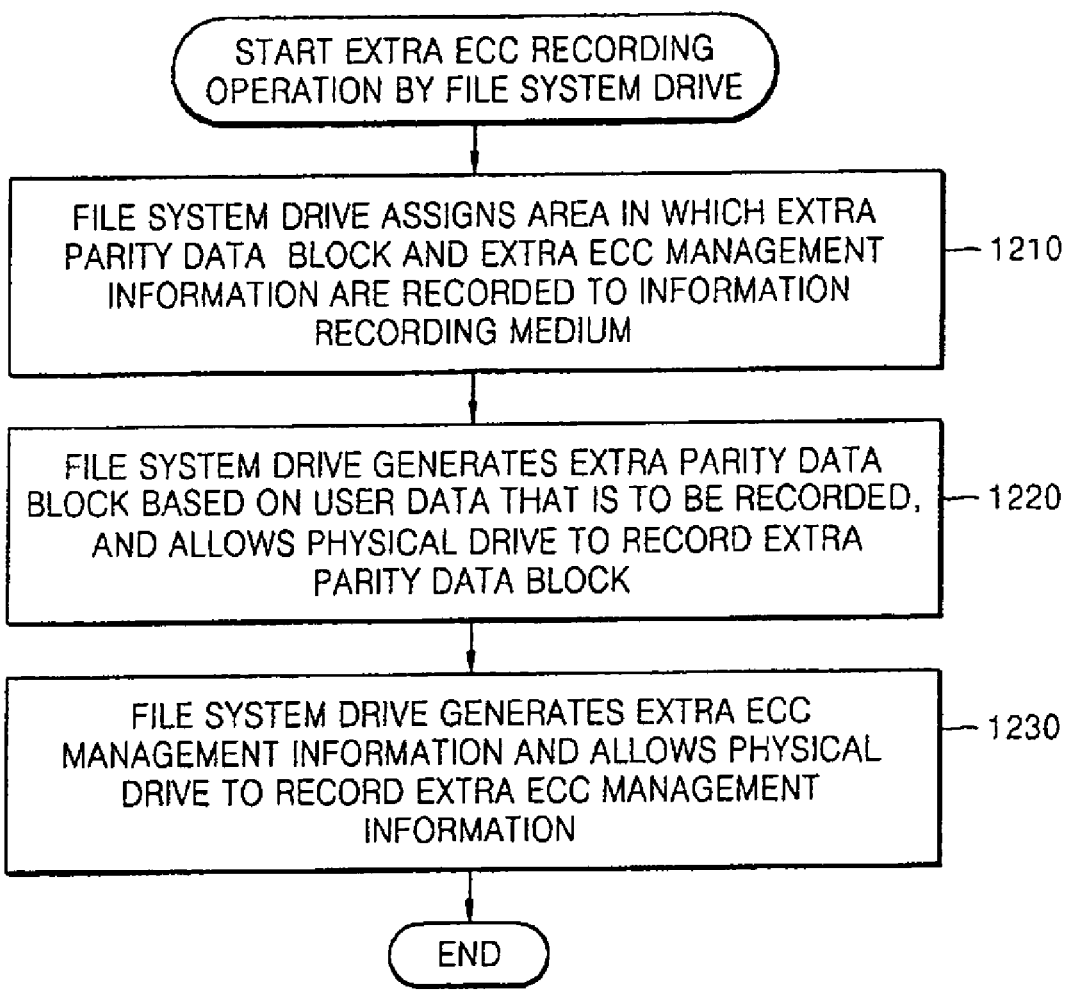
FIG. 12 is a flowchart illustrating a recording operation performed by the recording/reproducing apparatus illustrated in FIG. 11, according to an embodiment of the present invention.

Hereinafter, the operation of the recording/reproducing apparatus for performing extra ECC by the file system drive 820 will be described with reference to FIGS. 11 and 12. When the information recording medium 200 is loaded or installed in the physical drive 810, the file system drive 820 assigns an extra parity data block area 280 for extra parity data blocks 140 and an extra ECC management information area 290 for extra ECC management information to the information recording medium 200, according to a predetermined extra ECC application rate (operation 1210). Since the physical drive 810 does not recognize the extra ECC, the areas must be assigned so that the areas exist in a logical volume space. Since the logic volume space is an area in which data is recorded or managed by a recording command of the file system drive 820, the area recorded and managed by the physical drive 810 must be separated from the logic volume space.

In order to record user data, the file system drive 820 generates an extra parity data block 140 for user data, using the extra ECC encoder/decoder 241 and the ECC encoder/decoder included in a physical data processor of the physical drive 810, according to a predetermined extra ECC application rate, under the control of the extra ECC controller 211. The file system drive 820 sends information on a location in which user data will be recorded and a data recording command to the physical drive 810, and also sends the extra parity data block 140 and information on a location in which the extra parity data block 140 will be recorded on an area assigned by the file system drive 820, to the physical drive 810, in order to perform recording (operation 1220).

Also, an embodiment of extra ECC management information includes extra ECC definition information and information indicating a mapping relation between a location in which user data is recorded and a location in which extra parity data blocks 140 are recorded. While not required in all aspects, the mapping relation can be in the form of a table storing location information for a location of the user data and location information for a location for the corresponding extra parity data blocks.

The extra ECC management information is generated, and a recording command for recoding the extra ECC management information in an area assigned by the file system drive 820 is output to the physical drive 810 (operation 1230). Since the extra ECC management information, which is a type of user data management information, is data which must be managed by the file system drive 820, the extra ECC management information must be managed together with file system data. Accordingly, the extra ECC controller 211 in the file system drive 820 can determine whether extra ECC is applied based on the fife system data.

Figure 13:
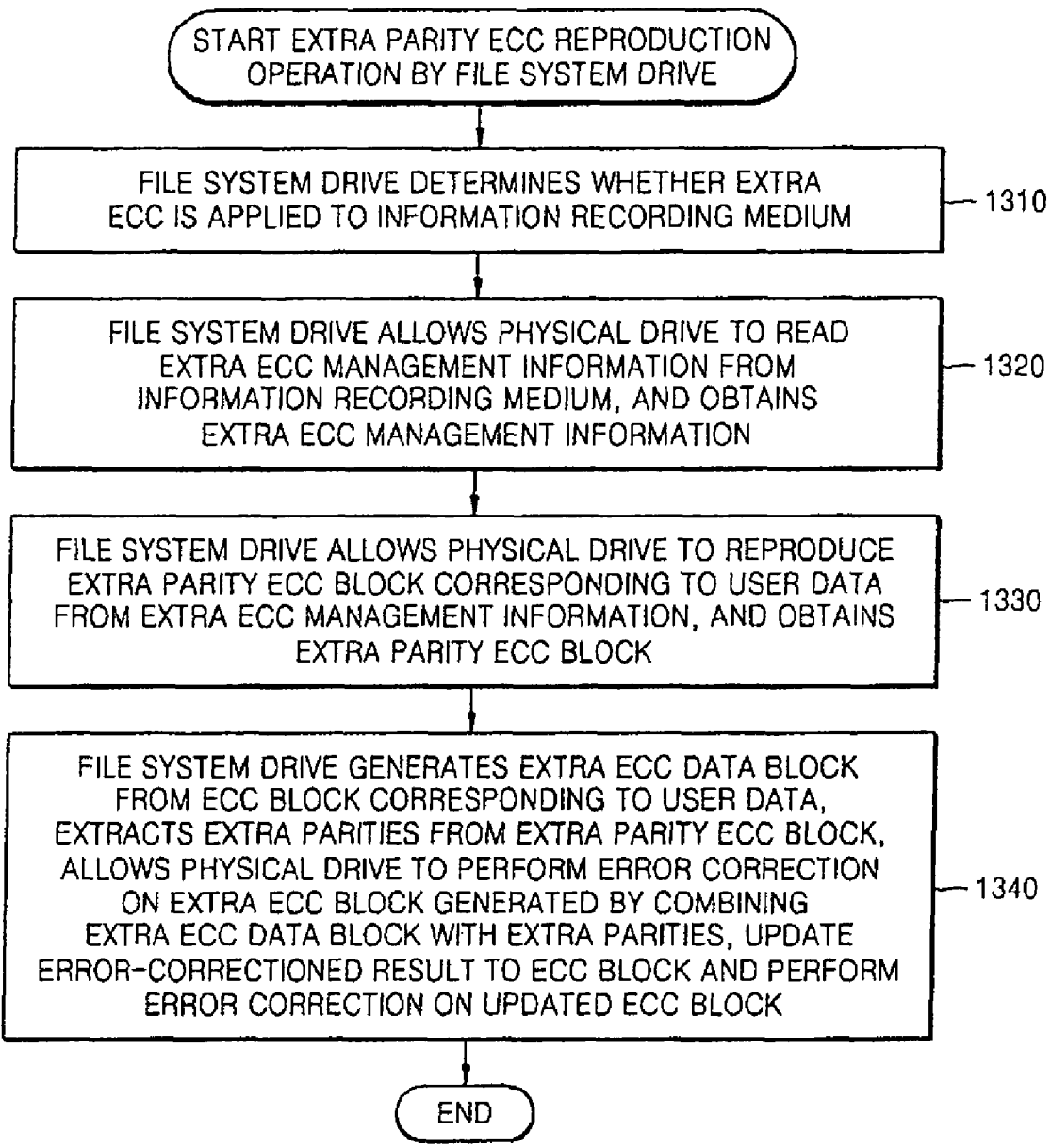
FIG. 13 is a flowchart illustrating a reproducing operation performed by the recording/reproducing apparatus illustrated in FIG. 11, according to an embodiment of the present invention.

Hereinafter, a reproduction operation in which the recording/reproducing apparatus performs extra ECC by using the file system drive 820 will be described with reference to FIGS. 11 and 13. When the data is reproduced from the information recording medium 200, the extra ECC controller 211 of the file system drive 820 determines whether extra ECC is applied based on file system data (operation 1310), allows the physical drive 810 to read extra ECC management information from the information recording medium, and obtains the extra ECC management information from an extra ECC management information area (operation 1320). In response to a user's data reproduction command, the extra ECC controller 211 of the file system drive 820 receives an ECC block for user data, and allows the physical drive 810 to reproduce an extra parity ECC block 150 corresponding to the user data from the extra ECC management information, and obtains the extra parity ECC block 150 (operation 1330).

Under the control of the extra ECC controller 211, the extra ECC encoder/decoder 241 obtains extra parities for the user data from the extra parity ECC block 150, and combines the ECC block for user data with the extra ECC data block 120 generated by the extra ECC encoder/decoder 241, thus generating an extra ECC block 130.

Also, the file system drive 820 transfers the extra ECC block 130 to the physical drive 810, allows the ECC encoder/decoder 241 of the physical data processor to perform error correction on the extra ECC block 130, and receives an error-corrected extra ECC block 130. The extra EGG controller 211 updates the extra ECC data block 120 of the received extra ECC block 130 to an ECC block for user data, transfers the updated ECC block to the physical drive 810, allows the ECC encoder/decoder 241 of the physical data processor to perform error correction on the ECC block, and obtains error-corrected user data (operation 1340). The method for operating extra ECC by using both the physical drive and the file system drive according to an aspect of the invention includes two methods as described below. In one of the two methods, the physical drive 810 generates/records/reproduces the extra parity data blocks 140 for extra ECC, restores the user data in ECC blocks using extra parities, generates/updates/records/reproduces the extra EGG management information, etc. The file system drive 820 performs assignment of an extra ECC management information area 280 for extra ECC management information and an extra parity data blocks area 290 for extra parity data blocks 140 included in a logic volume space for extra.

In the other of the two methods, the physical drive 810 provides a function of generating extra parity data blocks 140 when data is recorded, and a function of restoring data in ECC blocks using extra parities when data is reproduced. The file system drive 820 performs the remaining functions for extra ECC.

Figure 15:
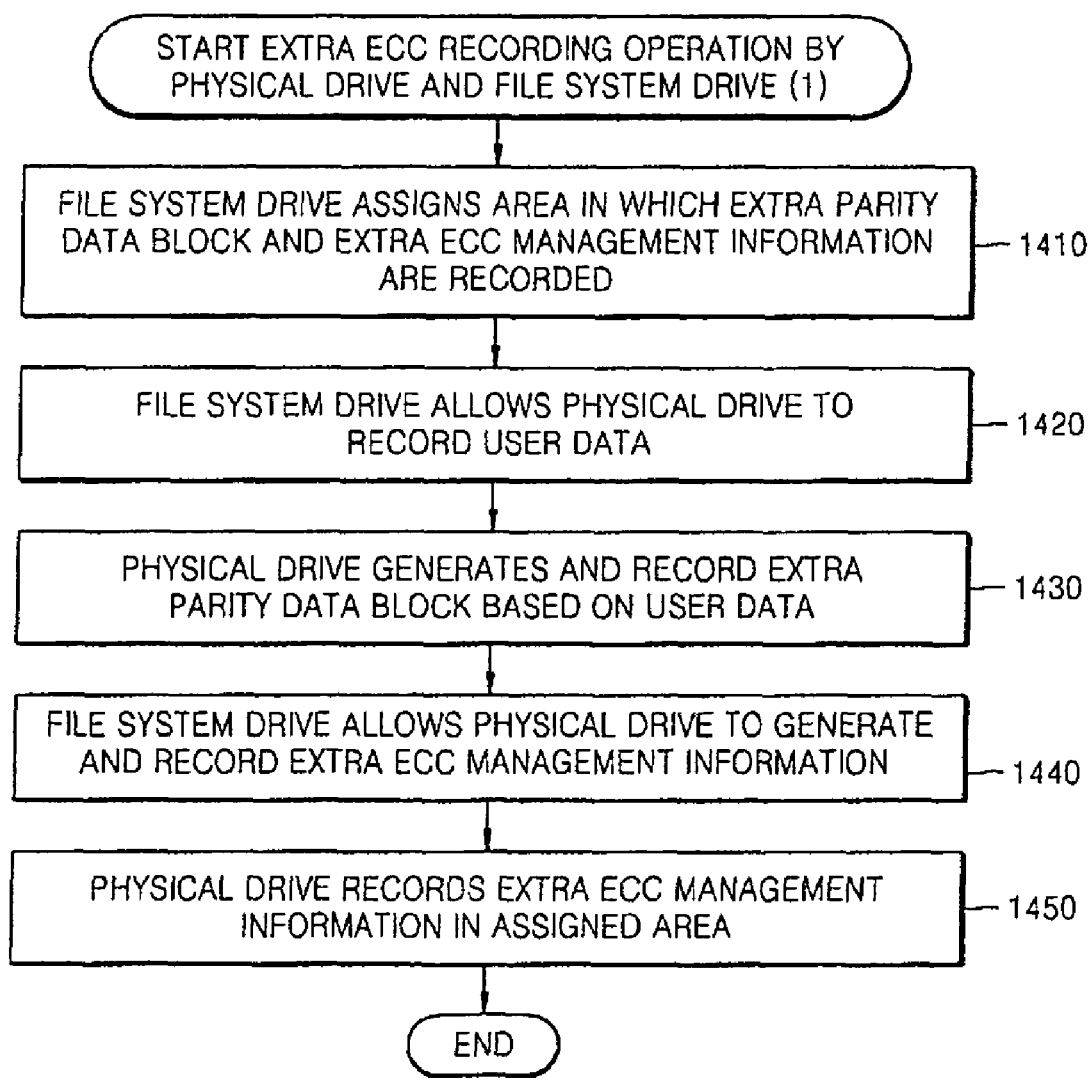
FIG. 15 is a flowchart illustrating a recording operation performed by the recording/reproducing apparatus illustrated in FIG. 14, according to an embodiment of the present invention.

FIG. 14 is a block diagram of a recording/reproducing apparatus for performing extra ECC by using a physical drive 810 and a file system drive 820, according to an embodiment of the present invention. Referring to FIG. 14, the recording/reproducing apparatus includes the file system drive 820 and the physical drive 810. An extra ECC controller 211 for performing extra ECC is included in both a controller 811 in the physical drive 810 and a controller 822 in the file system drive 820. An extra ECO encoder/decoder 241 is included in a physical data processor 240 in the physical drive 810. Hereinafter, an exemplary recording operation in which the recording/reproducing apparatus performs extra ECC by the file system drive 820 and the physical drive 810 will be described with reference to FIGS. 14 and 15.

The extra ECC encoder/decoder 241 of the physical drive 810 and the extra ECC controller 211 of the physical driver 810 only generate extra parity data blocks 140 for user data, under the control of the extra ECC controller 211 of the file system drive 820, when data is recorded. Also, when data is reproduced, extra parities are extracted from the extra parity data blocks 140 under the control of the extra ECC controller 211 of the file system drive 820, an extra ECC data block 120 is generated from an ECC block that is to be reproduced, under the control of the extra ECC controller 211 of the file system drive 820. The extra ECC data block 120 is combined with the extracted extra parities, and then an extra ECC block 130 is generated. Then, error correction is performed on the extra ECC block 130, the error-corrected extra ECC block 130 is updated to an ECC block, error correction is performed on the updated ECC block by the ECC encoder/decoder 241 in the physical data processor 240, and the corrected user data is transferred to the file system drive 820. Assignment of the remaining extra ECC-related areas and recording/reproducing/managing of extra ECC management information are performed by the file system drive 820.

The extra ECC controller 211 of the file system drive 820 assigns areas in which the extra parity data blocks 140 and the extra ECC management information are to be recorded according to a predetermined extra ECC application rate (operation 1410), to the information recording medium 200. Then, the extra ECC controller 211 of the file system drive 820 allows the physical drive 810 to generate the extra parity data blocks 140 for the user data which will be recorded according to a predetermined extra ECC application rate (operation 1420). Thus, the extra ECC controller 211 in the physical drive 810 allows the extra ECC encoder/decoder 241 to generate the extra parity data blocks 140 and transfers the generated extra parity data blocks 140 to the file system drive 820, and the extra ECC controller 211 in the file system drive 820 allows the physical drive 810 to record the extra parity data blocks 140 (operation 1430).

The file system drive 820 allows the physical drive 810 to generate and change extra ECC management information including extra ECC definition information and information indicating a mapping relation between location information of user data that is to be recorded and location information of the extra parity data blocks 140, and to record the extra ECC management information (operation 1440).

The physical drive 810 records the extra ECC management information in an assigned area of the information recording medium 200 (operation 1450).

Figure 16:
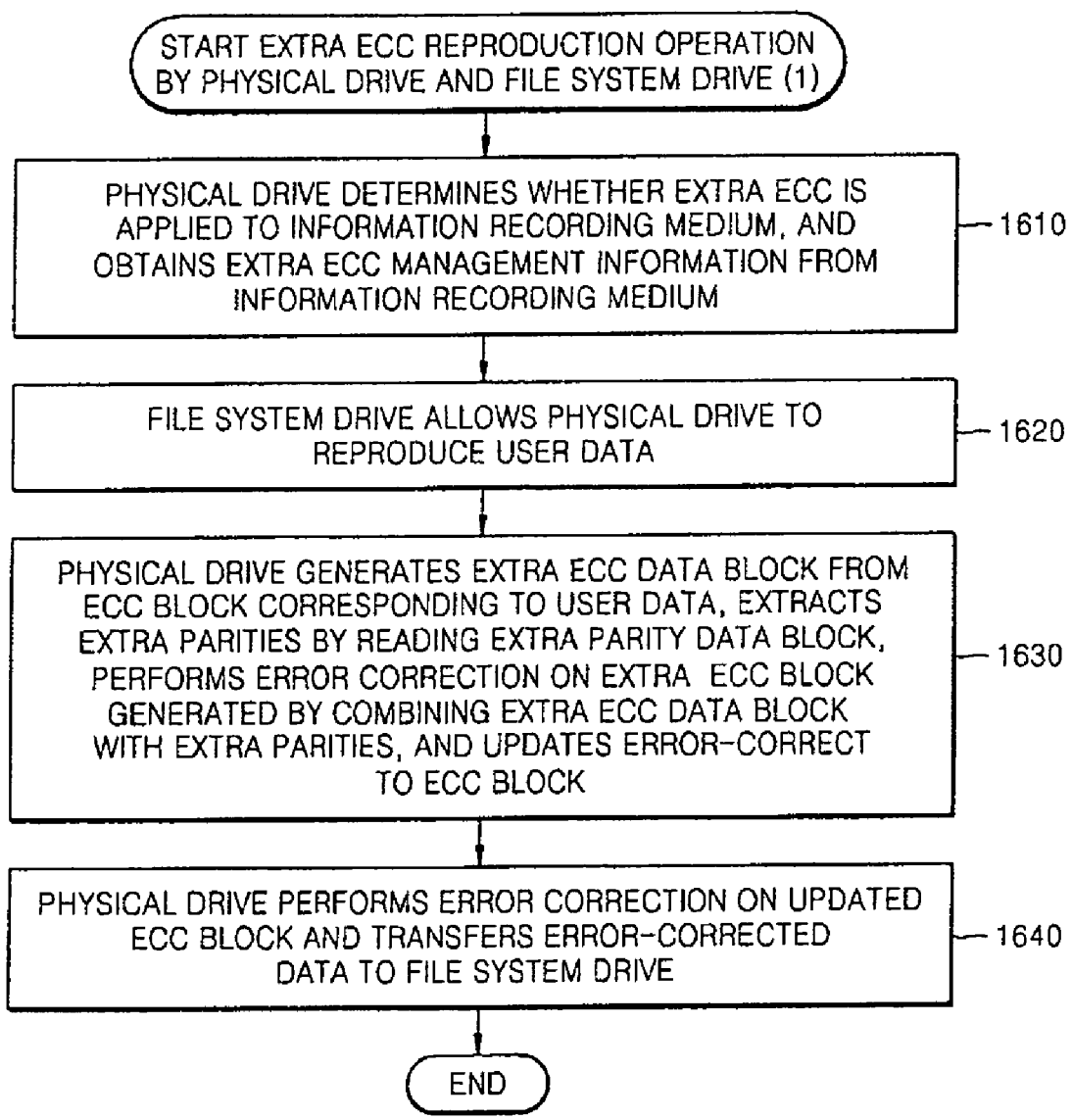
FIG. 16 is a flowchart illustrating a reproducing operation performed by the recording/reproducing apparatus illustrated in FIG. 14, according to an embodiment of the present invention.

Hereinafter, an exemplary reproducing operation in which the recording/reproducing apparatus performs extra ECC by the file system, drive 820 and the physical drive 810, will be described with reference to FIGS. 14 and 16. The extra ECC controller 211 in the file system drive 820 determines whether extra ECC has been applied to the information recording medium 200, obtains information on a location in which extra ECC management information is recorded, allows the physical drive 810 to read the extra ECC management information, and obtains the extra ECC management information (operation 1610).

When the user data is reproduced, the extra ECC controller 211 of the file system drive 820 obtains information on a location of an extra parity data block 140 for user data that is to be reproduced, from the extra ECC management information, and allows the physical drive 810 to reproduce the extra parity data block 140 (operation 1620).

The extra ECC controller 211 in the physical drive 810 generates an extra ECC block 130, using an ECC block for user data and extra parities obtained from the extra parity data block 140, by using an extra ECC decoder 241 in the physical drive 810, according to a command from the file system drive 820, performs error correction on the extra ECC block 130, and updates the error-corrected extra ECC block 130 to an ECC block (operation 1630). The extra ECC controller 211 in the physical drive 810 allows the ECC decoder in the physical drive 810 to perform error correction on the updated ECC block, and transfers the error-corrected user data to the file system drive 820 (operation 1640).

Figure 17:
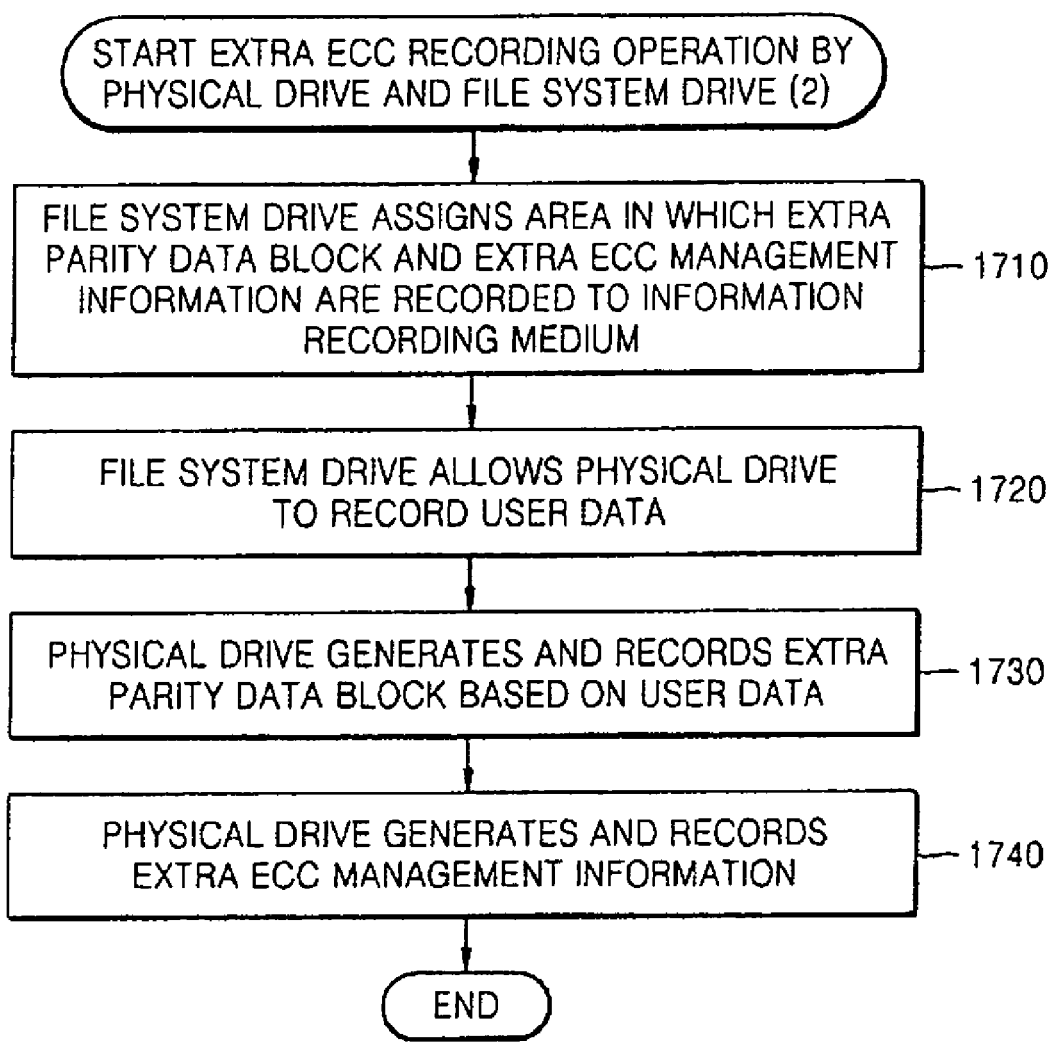
FIG. 17 is a flowchart illustrating a recording operation performed by the recording/reproducing apparatus illustrated in FIG. 14, according to another embodiment of the present invention.

Hereinafter, another recording operation in which the recording/reproducing apparatus performs extra ECC by using the file system drive 820 and the physical drive 810, will be described with reference to FIGS. 14 and 17. The extra ECC controller 211 of the file system drive 820 assigns areas in which extra parity data blocks 140 and extra ECC management information are recorded according to a predetermined extra ECC application rate, to the information recording medium 200 (operation 1710).

The extra ECC controller 211 of the file system drive 820 allows the physical drive 810 to generate an extra parity data block 140 for user data that is to be recorded (operation 1720). If the physical drive 810 receives a data recording command, an extra ECC encoder 241 generates an extra parity data block 140, under the control of the extra ECC controller 211 of the physical drive 810. The extra parity data block 140 is recorded on an extra parity data block area 290 assigned by the file system drive 820, under the control of the extra ECC controller 211 of the physical drive 810 (operation 1730).

The extra ECC controller 211 in the physical drive 810 generates extra ECC management information including extra ECC definition information and information indicating a mapping relation between location information in which the user data is recorded and location information in which the extra parity data blocks 140 are recorded, and records the extra ECC management information in an extra ECC management information area 280 assigned by the file system drive 820 (operation 1740).

Figure 18:
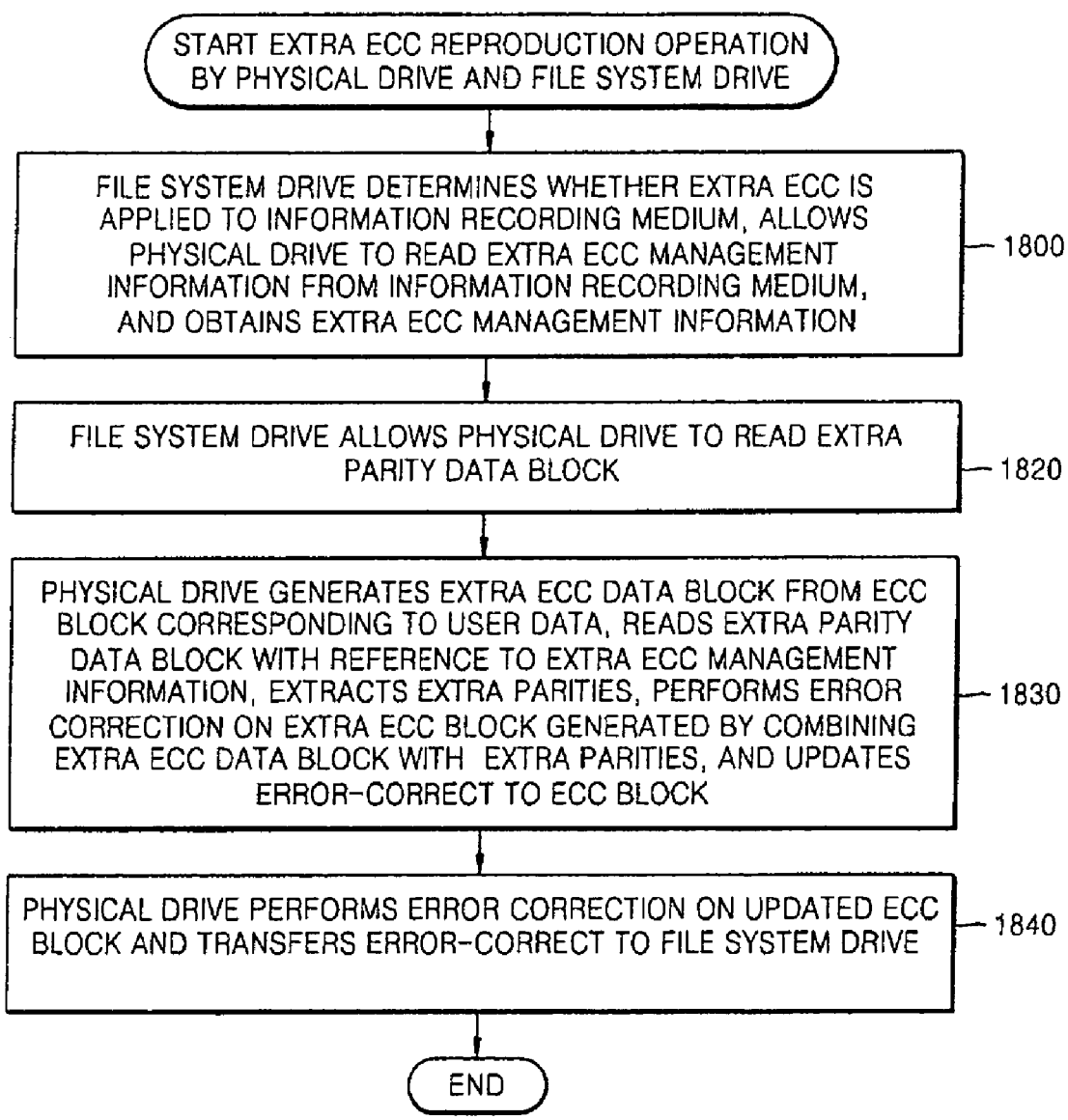
FIG. 18 is a flowchart illustrating a reproducing operation performed by the recording/reproducing apparatus illustrated in FIG. 14, according to another embodiment of the present invention.

Hereinafter, another reproducing operation in which the recording/reproducing apparatus performs extra ECC by using the file system drive 820 and the physical drive 810, will be described with reference to FIGS. 14 and 18. The extra ECC controller 211 in the physical drive 810 determines whether extra ECC has been applied to the information recording medium 200 that is loaded or installed in the physical drive 810, and reads and obtains extra ECC management information from the information recording medium 200 (operation 1810). The file system drive 820 outputs a user data reproduction command to the physical drive 810 (operation 1820). Thus, the extra ECC controller 211 of the physical drive 810 controls so that an extra parity data block 140 corresponding to user data that is to be reproduced is read from the extra ECC management information. Then, the extra ECC decoder 241 in the physical drive 810 generates an extra ECC block 130 by combining an ECC block for user data with extra parities extracted from the extra parity data block 140, performs error correction on the extra ECC block 130, and updates the error-corrected extra ECC block 130 to an ECC block (operation 1830).

Also, the extra ECC controller 211 of the physical drive 810 allows the ECC decoder 241 in the physical drive 810 to perform error correction on the updated ECC block, and transfers the error-corrected user data to the file system drive 820 (operation 1840).

The recording/reproducing method can also be embodied as computer readable codes on a computer readable recording medium. The computer readable recording medium is any data storage device that can store data which can be thereafter read by a computer system. Examples of the computer readable recording medium include read-only memory (ROM), random-access memory (RAM), COD-ROMs, magnetic tapes, floppy disks, optical data storage devices, and carrier waves (such as data transmission through the Internet). The computer readable recording medium can also be distributed over network coupled computer systems so that the computer readable code is stored and executed in a distributed fashion. Also, functional programs, codes, and code segments for accomplishing the present invention can be easily construed by programmers skilled in the art to which the present invention pertains.

As described above, according to the present invention, it is possible to more reliably record and reproduce data while ensuring compatibility with a conventional ECC format.

Although a few embodiments of the present invention have been shown and described, it would be appreciated by those skilled in the art that changes may be made in this embodi-

What is claimed is:

1. A recording apparatus for an information recording medium in which data is subjected to error correction coding (ECC) and stored, the recording apparatus comprising:
   an extra ECC encoder to generate an extra parity data block, the extra ECC encoder comprising:
      an extra parity generator to generate an extra ECC data block based on ECC encoded data that is to be recorded on the information recording medium, to perform ECC on the generated extra ECC data block to obtain an extra ECC block, and to generate at least one extra parity from the obtained extra ECC block, and
      an extra parity interleaver to interleave the generated at least one extra parity and to generate the extra parity data block; and
   an extra ECC controller determining whether extra ECC is applied to the information recording medium, and controlling the extra ECC encoder to generate the extra parity data block corresponding to data that is to be recorded on the information storage medium.

2. The recording apparatus of claim 1, wherein:
   the extra ECC controller further sets an extra ECC application rate, and whether an extra ECC process performed by the extra ECC controller is applied to the information recording medium, and
   the extra ECC application rate is set in advance or according to an input from a user interface.

3. The recording apparatus of claim 2, wherein:
   the extra parity interleaver collects and interleaves extra parities equal to or less than N at least one time, if the extra ECC application rate is 1/N.

4. The recording apparatus of claim 1, wherein the extra ECC controller further generates extra ECC management information for managing an extra ECC process performed by the extra ECC controller.

5. The recording apparatus of claim 4, wherein the extra ECC management information includes:
   information indicating whether the extra ECC process is applied to the information recording medium, and
   information indicating a mapping relation between a location on the information recording medium at which the ECC encoded data is to be recorded and a location on the information recording medium at which the extra parity data block is to be recorded.

6. The recording apparatus of claim 4, wherein the extra ECC controller assigns an area on the information recording medium on which the extra parity data block and the extra ECC management information are recorded.

7. The recording apparatus of claim 1, wherein the extra parity generator generates the extra ECC data block, from an error correction block generated from the ECC encoded data, the ECC encoded data, or other data generated from the ECC encoded data through a series of process steps.

8. A reproducing apparatus for an information recording medium in which data and an extra parity data block are subjected to error correction coding (ECC) and stored, the reproducing apparatus comprising:
   an extra ECC controller determining whether ECC encoded data is to be reproduced from the information recording medium using an extra ECC process, and, if the ECC encoded data is to be reproduced from the information recording medium using the extra ECC process, obtaining from the information recording medium an extra parity data block corresponding to the ECC encoded data that is to be reproduced;
   an extra parity deinterleaver deinterleaving the obtained extra parity data block and obtaining at least one extra parity from the deinterleaved extra parity data block;
   an extra ECC block decoder generating an extra ECC block by combining an extra ECC data block with the obtained at least one extra parity, and performing error correction on the generated extra ECC block, the extra ECC data block having been generated from an ECC block for the ECC encoded data that is to be reproduced;
   an extra ECC block updater updating the extra ECC data block obtained from the error-corrected extra ECC block to a corresponding ECC block for the ECC encoded data that is to be reproduced; and
   an ECC decoder performing error correction on the updated ECC block to obtain the data.

9. The reproducing apparatus of claim 8, wherein the extra ECC controller obtains location information of the extra parity data block and information indicating whether the extra ECC process is applied to the information recording medium, from extra ECC management information read from the information recording medium.

10. A recording apparatus for an information recording medium in which data is subjected to error correction coding (ECC) and stored, the recording apparatus comprising:
    a file system drive outputting a data writing command to record the data; and
    a physical drive receiving the data writing command from the file system drive to perform an extra ECC process by generating an extra parity data block corresponding to the data after ECC encoding, to record the extra parity data block on the information recording medium, and to manage and perform an extra ECC process,
    wherein the extra ECC is executed by interleaving of rows of initial error correction coded data.

11. The recording apparatus of claim 10, wherein the physical drive comprises:
    an extra ECC encoder comprising:
       an extra parity generator generating an extra ECC data block based on the ECC encoded data that is to be recorded on the information recording medium, and generating at least one extra parity by performing ECC process on the generated extra ECC data block; and
       an extra parity interleaver generating the extra parity data block by interleaving the generated at least one extra parity; and
    an extra ECC controller determining whether the extra ECC process is applied to the information recording medium, and, when the extra ECC process is applied to the information recording medium, controlling the extra ECC encoder to generate the extra parity data block corresponding to the ECC encoded data that is to be recorded on the information recording medium.

12. The recording apparatus of claim 11, wherein the extra ECC controller further generates extra ECC management information which includes information indicating a mapping relation between a location on the information recording medium at which the ECC encoded data is to be recorded and a location on the information recording medium at which the extra parity data block is to be recorded.

13. The recording apparatus of claim 12, wherein the extra ECC controller assigns an area of the information recording medium on which the extra parity data block and the extra ECC management information are recorded, and controls the apparatus to record the extra parity data block and the extra ECC management information on the assigned area.

14. A reproducing apparatus for an information recording medium in which data is subjected to error correction coding (ECC) and stored, the reproducing apparatus comprising:
a file system drive outputting a data read command; and
a physical drive receiving the data read command from the file system drive, and performing an extra ECC process by reading from the information recording medium an extra parity data block corresponding to ECC data recorded on the information recording medium, performing error correction on the extra parity data block, and transferring the error-corrected extra parity data block to the file system drive for use in ECC decoding the ECC data,
wherein the extra ECC is executed by interleaving of rows of initial error correction coded data.

15. The reproducing apparatus of claim 14, wherein the physical drive comprises:
an extra ECC controller determining whether the ECC data must be reproduced from the information recording medium using the extra ECC process, and obtaining the extra parity data block corresponding to the ECC data that is to be reproduced from the information recording medium;
an extra parity deinterleaver deinterleaving the extra parity data block and obtaining at least one extra parity from the deinterleaved extra parity data block;
an extra ECC block decoder generating an extra ECC block by combining an extra ECC data block with the at least one extra parity, and performing error correction on the generated extra ECC block, the extra ECC data block being created from an ECC block for the ECC data;
an extra ECC block updater updating the extra ECC data block obtained from the error-corrected extra ECC block to a corresponding ECC block; and
an ECC decoder performing error correction on the updated ECC block to obtain the data.

16. The reproducing apparatus of claim 15, wherein:
the extra ECC controller uses extra ECC management information to obtain the extra parity data block, and
the extra ECC management information includes information indicating a mapping relation between a location on the information recording medium of the ECC data and a location on the information recording medium of the extra parity data block.

17. The reproducing apparatus of claim 16, wherein the extra ECC controller obtains information indicating whether the extra ECC process is applied to the information recording medium and location information of the extra parity data block, from the extra ECC management information read from the information recording medium.

18. A recording apparatus for an information recording medium in which data is subjected to error correction coding (ECC) and stored, the recording apparatus comprising:
a physical drive transferring/receiving at least one part of an ECC block of user data; and
a file system drive receiving the at least one part of the ECC block from the physical drive, generating an extra parity data block using the at least one block of the ECC block, and managing extra ECC recording of the generated extra parity data block,
wherein the extra ECC is executed by interleaving of rows of initial error correction coded data.

19. The recording apparatus of claim 18, wherein: the file system drive comprises:
an extra ECC encoder comprising:
an extra parity generator generating an extra ECC data block based on the at least one part of an ECC block that is to be recorded on the information recording medium, performing ECC on the extra ECC data block, and generating at least one extra parity; and
an extra parity interleaver generating the extra parity data block by interleaving the generated at least one extra parity; and
an extra ECC controller determining whether the extra ECC recording is applied to the information recording medium, and if the extra ECC recording is applied, receiving the at least one part of the ECC block from the physical drive, controlling the extra ECC encoder to generate the extra parity data block from the received part of the ECC block, and allowing the physical drive to record the generated extra parity data block on the information recording medium.

20. The recording apparatus of claim 19, wherein the extra ECC controller further generates extra ECC management information which includes information indicating a mapping relation between a location on the information recording medium of the ECC block of the user data that is to be recorded and a location at which the extra parity data block is recorded on the information recording medium, and allows the physical drive to record the extra ECC management information on the information recording medium.

21. The recording apparatus of claim 20, wherein the extra ECC controller assigns an area on the information recording medium on which the extra parity data block and the extra ECC management information are recorded, and allows the physical drive to record the extra parity data block and the extra ECC management information in the assigned area.

22. A reproducing apparatus for an information recording medium in which data is subjected to error correction coding (ECC) and stored, the reproducing apparatus comprising:
a physical drive reading, from the information recording medium, an extra parity data block corresponding to ECC encoded user data, and transferring the read extra parity data block, in response to a data read command; and
a file system drive performing error correction on the transferred extra parity data block received from the physical drive, and managing and performing an extra ECC process using the data read command and/or the extra parity data block,
wherein the extra ECC is executed by interleaving of rows of initial error correction coded data.

23. The reproducing apparatus of claim 22, wherein the file system drive comprises:
an extra ECC controller determining whether the ECC encoded user data must be reproduced from the information recording medium using the extra ECC process, and obtaining the extra parity data block corresponding to the ECC encoded user data that is to be reproduced from the information recording medium;
an extra parity deinterleaver obtaining at least one extra parity by deinterleaving the obtained extra parity data block; and
an extra ECC block decoder generating an extra ECC block by combining an extra ECC data block with the obtained at least one extra parity, and performing error correction on the generated extra ECC block, the extra ECC data block being created from an ECC block for the ECC encoded user data that is to be reproduced; and
an extra ECC block updater updating the extra ECC data block obtained from the error-corrected extra ECC block to a form the ECC block.

24. The reproducing apparatus of claim 23, wherein:
the extra ECC controller uses extra ECC management information while performing the extra ECC process, and
the extra ECC management information includes information indicating a mapping relation between a location on the information recording medium of the ECC encoded user data and a location on the information recording medium of the extra parity data block.

25. The reproducing apparatus of claim 24, wherein, from the extra ECC management information read from the information recording medium, the extra ECC controller obtains information indicating whether the extra ECC process is applied to the information recording medium and location information of the extra parity data block.

26. A recording apparatus for an information recording medium in which data is subjected to error correction coding (ECC) and stored, the recording apparatus comprising:
a file system drive transmitting a command to generate an extra parity data block from ECC encoded user data; and
a physical drive receiving the transmitted command and being controlled by the file system drive to generate the extra parity data block from the ECC encoded user data and to record the extra parity data block on the information recording medium according to the transmitted command,
wherein the file system drive performs an extra ECC process together with the physical drive to create and record the extra parity data block, and
wherein the extra ECC is executed by interleaving of rows of initial error correction coded data.

27. The recording apparatus of claim 26, wherein the file system drive:
generates and manages extra ECC management information which includes information indicating a mapping relation between a location on the information recording medium at which the ECC encoded user data is recorded and a location on the information recording medium at which the extra parity data block is recorded, and
assigns an area of the information recording medium at which the extra parity data block and the extra ECC management information are recorded.

28. The recording apparatus of claim 26, wherein:
the file system drive generates and manages extra ECC management information which includes information indicating a mapping relation between a location on the information recording medium at which the ECC encoded user data is recorded and a location on the information recording medium at which the extra parity data block is recorded, and
the physical drive assigns an area of the information recording medium at which the extra parity data block and the extra ECC management information are recorded.

29. A reproducing apparatus for an information recording medium in which data is subjected to error correction coding (ECC) and stored, the reproducing apparatus comprising:
a file system drive transmitting a command to read ECC encoded user data from the information recording medium;
a physical drive to receive the transmitted command and being controlled by the file system drive to read, from the information recording medium, an extra parity data block corresponding to the ECC encoded user data, to perform error correction on the read extra parity data block, and to transfer the error-corrected extra parity data block to the file system drive,
wherein the file system drive performs an extra ECC process together with the physical drive to decode the extra parity data block and the ECC encoded user data, and
wherein the extra ECC is executed by interleaving of rows of initial error correction coded data.

30. The reproducing apparatus of claim 29, wherein the file system drive generates and manages extra ECC management information which includes information indicating a mapping relation between a location on the information recording medium at which the ECC encoded user data is recorded and a location on the information recording medium at which the extra parity data block is recorded.

31. The reproducing apparatus of claim 29, wherein:
the file system drive generates and manages extra ECC management information which includes information indicating a mapping relation between a location on the information recording medium at which the ECC encoded user data is recorded and a location on the information recording medium at which the extra parity data block is recorded, and
the physical drive assigns an area on the information recording medium at which the extra parity data block and the extra ECC management information are recorded.

32. A method of recording data in an information recording medium in which data is subjected to error correction coding (ECC) and stored, the method comprising:
determining whether an extra ECC process is applied to the information recording medium; and
if the extra ECC process is applied to the information recording medium,
generating an extra ECC data block based on ECC encoded data that is to be recorded on the information recording medium,
performing ECC on the generated extra ECC data block,
generating at least one extra parity using the generated extra ECC data block,
generating an extra parity data block by interleaving the generated at least one extra parity, and
recording the generated extra parity data block on the information recording medium.

33. The method of claim 32, further comprising setting an extra ECC application rate, wherein whether the extra ECC process is applied to the information recording medium and the extra ECC application rate are set in advance or according to an input from a user interface.

34. The method of claim 32, further comprising generating extra ECC management information for managing the extra ECC process.

35. The method of claim 34, wherein the generated extra ECC management information includes:
information indicating whether the extra ECC process is applied, and
information indicating a mapping relation between a location on the information recording medium at the ECC encoded data is to be recorded and a location on the information recording medium at which the generated extra parity data block is to be recorded.

36. The method of claim 34, further comprising assigning an area of the information recording medium at which the generated extra parity data block and the generated extra ECC management information are recorded.

37. The method of claim 32, wherein the extra ECC data block is generated from an error-corrected block generated from the ECC encoded data, the ECC encoded data, or other data generated from the ECC encoded data through a series of process steps.

38. A method of reproducing data from an information recording medium in which data and an extra parity data block are subjected to error correction coding (ECC) and stored, the method comprising:
- determining whether ECC encoded data is to be reproduced from the information recording medium using an extra ECC process; and
- if it is determined that the extra ECC process is to be used,
  - reading, from the information recording medium, an extra parity data block corresponding to the ECC encoded data that is to be reproduced,
  - deinterleaving the read extra parity data block,
  - obtaining at least one extra parity from the deinterleaved extra parity data block,
  - generating an extra ECC block by combining an extra ECC data block with the obtained at least one extra parity, and performing error correction on the generated extra ECC block, the extra ECC data block having been generated from an ECC block for the ECC encoded data that is to be reproduced,
  - updating the extra ECC data block obtained from the error-corrected extra ECC block to a corresponding ECC block; and
  - performing error correction on the updated ECC block.

39. The method of claim 38, further comprising reading extra ECC management information from the information recording medium to obtain information indicating whether the extra ECC process is used with the information recording medium and location information of the extra parity data block.

40. A method of recording data in an information recording medium in which data is subjected to error correction coding (ECC) and stored, the method comprising:
- transferring a data write command to a physical drive of an apparatus from a file system drive of the apparatus; and
- at the physical drive, receiving the data write command from the file system drive, generating an extra parity data block corresponding to ECC encoded data, recording the extra parity data block on the information recording medium, and managing and performing extra ECC by the physical drive with respect to the of the extra parity data block and the ECC encoded data,
- wherein the extra ECC is executed by interleaving of rows of initial error correction coded data.

41. A method of reproducing data from information recording medium in which data is subjected to error correction coding (ECC) and stored, the method comprising:
- transferring a file system drive of an apparatus a data read command to a physical drive of the apparatus; and
- at the physical drive, receiving the data read command from the file system drive, reading an extra parity data block from the information recording medium and which corresponds to ECC encoded data to be reproduced, performing error correction on the extra parity data block, and transferring the error-corrected extra parity data block to the file system drive,
- wherein the extra ECC is executed by interleaving of rows of initial error correction coded data.

42. A method of recording data in an information recording medium in which data is subjected to error correction coding (ECC) and stored, the method comprising:
- transferring and/or receiving from a physical drive of an apparatus at least one part of an ECC block of user data with respect to a file system drive of the apparatus; and
- at the file system drive, receiving the at least one part of the ECC block from the physical drive, generating an extra parity data block from the ECC block, and performing recording of extra ECC process by recording the generated extra parity data block,
- wherein the extra ECC is executed by interleaving of rows of initial error correction coded data.

43. A method of reproducing data from an information recording medium in which data is subjected to error correction coding (ECC) and stored, the method comprising:
- at a physical drive of an apparatus and in response to a data read command sent from the file system drive, reading an extra parity data block corresponding to ECC encoded user data from the information recording medium, and transferring the extra parity data block to the file system drive; and
- at the file system drive, performing error correction on the transferred extra parity data block received from the physical drive, and managing and performing extra ECC with respect to the extra parity data block and the ECC encoded user data,
- wherein the extra ECC is executed by interleaving of rows of initial error correction coded data.

44. A method of recording data in an information recording medium in which data is subjected to error correction coding (ECC) and stored, the method comprising:
- at a file system drive of an apparatus, controlling a physical drive of the apparatus to generate an extra parity data block for ECC encoded user data; and
- the physical drive being controlled by the file system drive to generate the extra parity data block from the user data and record the generated extra parity data block on the information recording medium such that the file system drive performs an extra ECC recording process together with the physical drive,
- wherein the extra ECC is executed by interleaving of rows of initial error correction coded data.

45. A method of reproducing data from an information recording medium in which data is subjected to error correction coding (ECC) and stored, the method comprising:
- at a file system drive of an apparatus, controlling a physical drive of the apparatus to read ECC encoded user data from the information recording medium; and
- the physical drive being controlled by the file system drive to read an extra parity data block corresponding to the read ECC encoded user data from the information recording medium, perform error correction on the read extra parity data block, and transfer the error-corrected extra parity data block to the file system drive such that the file system drive performs an extra ECC reproducing process together with the physical drive,
- wherein the extra ECC is executed by interleaving of rows of initial error correction coded data.

46. A recording and/or reproducing apparatus for an information recording medium, comprising:
- an optical pickup;
- a first ECC encoder/decoder to ECC encode/decode data transferred with respect to the information recording medium in units of ECC blocks;
- a second ECC encoder/decoder to generate extra ECC blocks based on the ECC blocks using extra parity data blocks, each of the extra parity data blocks including at least one extra parity from the corresponding extra ECC block; and
- a controller to control the optical pickup to transfer the ECC data with respect to the information recording medium, to control the first ECC encoder/decoder to encode/decode the data to be transferred in the ECC blocks, and controls the second ECC encoder/decoder to generate the extra parity data block corresponding to data that is to be recorded on the information storage medium and/or to obtain from the extra parity data blocks stored on the information storage medium the corresponding extra parities for the data that is to be reproduced from the information storage medium using the extra ECC block, wherein the extra ECC is executed by interleaving of rows of initial error correction coded data.

47. The recording and/or reproducing apparatus of claim 46, wherein controller further transfers extra ECC management information with respect to the information recording medium, and uses the extra ECC management information to relate the data to be recorded and/or reproduced with the corresponding extra parity data blocks.

48. The recording and/or reproducing apparatus of claim 47, wherein the extra ECC management information comprises location information connecting the data to be recorded and/or reproduced and location information of the corresponding extra parity data blocks.

49. The recording and/or reproducing apparatus of claim 46, wherein:

the extra parity data blocks are recorded on a first area of the information recording medium, the data is recorded on a second area of the information recording medium other than the first area, and the controller further transfers the data with respect to the second area and the extra parity data blocks with respect to the first area.

50. The recording and/or reproducing apparatus of claim 49, wherein:

the information recording medium includes a user data area and a management information area including management information used by the controller to manage the user data area, and the user data area includes the first and second areas.

51. The recording and/or reproducing apparatus of claim 50, wherein controller further transfers extra ECC management information with respect to the second area, and uses the extra ECC management information to relate the data to be recorded and/or reproduced with respect to the first area with the corresponding extra parity data blocks of the second area.

52. The recording and/or reproducing apparatus of claim 46, wherein:

the first ECC encoder/decoder ECC encodes/decodes in units of the ECC blocks according to a Reed-Solomon Product Code (RSPC) format, and the second ECC encoder/decoder generates the extra ECC blocks according to the RSPC format.

53. A recording and/or reproducing apparatus for use with an information recording medium, the apparatus comprising:

an optical pickup;

an ECC encoder to ECC encode user data to generate ECC blocks having user data blocks, to ECC encode the user data blocks using corresponding extra parities to generate extra ECC blocks, and to form extra parity data blocks from the extra parities of the generated extra ECC blocks; and a controller to control the optical pickup to record the ECC blocks in a first area of the information recording medium, and to record the extra parity data blocks in a second area of the information recording medium.

54. The recording apparatus of claim 53, wherein:

the ECC encoder, to form the extra parity data blocks, uses the extra parities of the generated extra ECC blocks to form parity ECC blocks, interleaves the extra parities included in the formed parity ECC blocks to obtain the extra parity data blocks, and forms extra parity ECC blocks, and the controller, to record the extra parity data blocks, controls the optical pickup to record the extra parity ECC blocks in the second area of the information recording medium.

55. The recording apparatus of claim 54, wherein the controller further:

generates extra ECC management information to manage the ECC blocks and the extra parity ECC blocks, and controls the optical pickup to record the extra ECC management information in the second area of the information recording medium.

56. The recording apparatus of claim 53, wherein the ECC encoder comprises:

a first ECC encoder to ECC encode the user data blocks to generate the ECC blocks, and a second ECC encoder including:

an extra parity generator to generate the extra ECC data blocks from the user data blocks in the generated ECC blocks, to perform ECC on the generated extra ECC data blocks to obtain the extra ECC blocks, and to generate the extra parities from the obtained extra ECC blocks, and an extra parity interleaver to interleave the generated extra parities and to generate the extra parity data block.

57. An information recording medium, comprising:

a first area including error correction coding (ECC) encoded user data;

a second area other than the first area and including extra parity data blocks formed from extra parities of extra ECC blocks related to the ECC encoded user data;

an extra ECC management information area having extra ECC management information used by a recording and/or reproducing apparatus to decode the ECC encoded user data of the first area with the extra parity data blocks by re-forming the extra ECC blocks related to the ECC user data; and a management area including management information used by the recording and/or reproducing apparatus to manage the first area, the second area, and the extra ECC management information area, wherein the extra ECC is executed by interleaving of rows of initial error correction coded data.

* * * * *